(12) United States Patent
Wu et al.

(10) Patent No.: US 9,773,711 B2
(45) Date of Patent: Sep. 26, 2017

(54) PICKING-UP AND PLACING PROCESS FOR ELECTRONIC DEVICES AND ELECTRONIC MODULE

(71) Applicant: Industrial Technology Research Institute, Hsinchu (TW)

(72) Inventors: Ming-Hsien Wu, Tainan (TW); Yen-Hsiang Fang, New Taipei (TW)

(73) Assignee: Industrial Technology Research Institute, Hsinchu (TW)

( * ) Notice: Subject to any disclaimer, the term of this patent is extended or adjusted under 35 U.S.C. 154(b) by 0 days.

(21) Appl. No.: 15/060,616

(22) Filed: Mar. 4, 2016

(65) Prior Publication Data

US 2016/0268491 A1    Sep. 15, 2016

Related U.S. Application Data

(63) Continuation-in-part of application No. 14/954,993, filed on Nov. 30, 2015.
(Continued)

(30) Foreign Application Priority Data

Dec. 12, 2014 (TW) .............................. 103143505 A
Jun. 30, 2015 (TW) .............................. 104121139 A

(51) Int. Cl.
*H01L 33/32* (2010.01)
*H01L 33/58* (2010.01)
(Continued)

(52) U.S. Cl.
CPC .............. *H01L 22/20* (2013.01); *H01L 24/75* (2013.01); *H01L 24/81* (2013.01); *H01L 33/0079* (2013.01); *H01L 33/0095* (2013.01)

(58) Field of Classification Search
CPC . H01L 33/0079; H01L 33/0095; H01L 24/75; H01L 24/81
See application file for complete search history.

(56) References Cited

U.S. PATENT DOCUMENTS 6,329,832 B1    12/2001  Cobbley et al.
6,355,491 B1     3/2002  Zhou et al.
(Continued)

FOREIGN PATENT DOCUMENTS

CN    104067381    9/2014
CN    104604340    5/2015
(Continued)

OTHER PUBLICATIONS

"Notice of Allowance of Taiwan Counterpart Application", dated Oct. 26, 2016, p. 1-p. 3.
(Continued)

*Primary Examiner* — Marcos D Pizarro
*Assistant Examiner* — Long H Le
(74) *Attorney, Agent, or Firm* — Jianq Chyun IP Office

(57) ABSTRACT

A picking-up and placing process for electronic devices includes: forming a plurality of electronic devices arranged in an array on a carrier, wherein a first conductive layer having a conductive pattern is disposed between each of the electronic devices and the carrier, and a width of the electronic device is greater than that of the corresponding conductive pattern; selectively picking-up parts of the electronic devices and corresponding first conductive layers from the carrier via a picking-up and placing module; and placing the parts of the electronic devices and the corresponding first conductive layers on a target substrate by the picking-up and placing module. An electronic module is further provided.

20 Claims, 28 Drawing Sheets

Related U.S. Application Data

(60) Provisional application No. 62/085,657, filed on Dec. 1, 2014, provisional application No. 62/291,526, filed on Feb. 5, 2016.

(51) Int. Cl.
*H01L 33/62* (2010.01)
*H01L 33/00* (2010.01)
*H01L 21/66* (2006.01)
*H01L 23/00* (2006.01)

(56) References Cited

U.S. PATENT DOCUMENTS

| | | | |
|---|---|---|---|
| 7,205,214 | B2 | 4/2007 | Hayashi et al. |
| 7,521,292 | B2 | 4/2009 | Rogers et al. |
| 8,333,860 | B1 | 12/2012 | Bibl et al. |
| 8,349,116 | B1 | 1/2013 | Bibl et al. |
| 8,415,771 | B1 | 4/2013 | Golda et al. |
| 8,518,204 | B2 | 8/2013 | Hu et al. |
| 8,558,243 | B2 | 10/2013 | Bibl et al. |
| 8,573,469 | B2 | 11/2013 | Hu et al. |
| 8,646,505 | B2 | 2/2014 | Bibl et al. |
| 8,664,086 | B2 | 3/2014 | Ogihara |
| 8,789,573 | B2 | 7/2014 | Bibl et al. |
| 8,794,501 | B2 | 8/2014 | Bibl et al. |
| 8,905,772 | B2 | 12/2014 | Rogers et al. |
| 8,933,433 | B2 | 1/2015 | Higginson et al. |
| 8,945,968 | B2 | 2/2015 | Bibl et al. |
| 9,000,566 | B2 | 4/2015 | Golda et al. |
| 9,034,754 | B2 | 5/2015 | Golda et al. |
| 9,209,348 | B2 | 12/2015 | Hu et al. |
| 2003/0087476 | A1 | 5/2003 | Oohata et al. |
| 2004/0050912 | A1* | 3/2004 | Spencer ............ B23K 20/023 228/194 |
| 2005/0233546 | A1 | 10/2005 | Oohata et al. |
| 2007/0075422 | A1* | 4/2007 | Fujii ............ H01L 23/3114 257/737 |
| 2008/0160725 | A1 | 7/2008 | Byun et al. |
| 2009/0003971 | A1 | 1/2009 | Trovinger et al. |
| 2009/0039716 | A1 | 2/2009 | Ogawa et al. |
| 2011/0151602 | A1* | 6/2011 | Speier ............ H01L 33/0079 438/26 |
| 2012/0299147 | A1 | 11/2012 | Mitani |
| 2013/0126827 | A1 | 5/2013 | Bibl et al. |
| 2013/0128585 | A1 | 5/2013 | Bibl et al. |
| 2013/0130440 | A1* | 5/2013 | Hu ............ H01L 24/83 438/107 |
| 2013/0135507 | A1* | 5/2013 | Wu ............ H04N 9/3138 348/333.1 |
| 2014/0061687 | A1 | 3/2014 | Hu et al. |
| 2014/0094878 | A1 | 4/2014 | Gossler et al. |
| 2014/0290867 | A1 | 10/2014 | Bibl et al. |
| 2014/0340900 | A1 | 11/2014 | Bathurst et al. |
| 2015/0214420 | A1 | 7/2015 | Hu et al. |

FOREIGN PATENT DOCUMENTS

| | | |
|---|---|---|
| TW | 201306242 | 2/2013 |
| TW | 201327721 | 7/2013 |
| TW | 201327910 | 7/2013 |
| TW | 201330320 | 7/2013 |
| TW | 201347629 | 11/2013 |
| TW | 201444463 | 11/2014 |
| TW | 201505084 | 2/2015 |

OTHER PUBLICATIONS

Kim et al., "Generation of Local Magnetic Field by Nano Electro-Magnets," Japanese Journal of Applied Physics, Apr. 2004, pp. 2054-2056.

Zheng et al., "A BioMEMS chip with integrated micro electromagnet array towards bio-particles manipulation," Microelectronic Engineering, Jun. 2014, pp. 1-6.

Pal et al., "High temperature ferromagnetism and optical properties of Co doped ZnO nanoparticles," Journal of Applied Physics, Oct. 2010, pp. 084322.

"Office Action of Taiwan Related Application No. 102119638," dated Nov. 11, 2015, p. 1-p. 11.

"Office Action of U.S. Appl. No. 14/954,993," dated Jun. 2, 2016, p. 1-p. 17.

Park et al., "Printed Assemblies of Inorganic Light-Emitting Diodes for Deformable and Semitransparent Displays," Science, Aug. 2009, pp. 977-981, with Supporting Online Material thereof.

Ahn et al., "Omnidirectional Printing of Flexible, Stretchable, and Spanning Silver Microelectrodes," SCIENCE, Mar. 2009, pp. 1590-1593, with Supporting Online Material thereof.

Sagimori et al., "LED Array with Higher Heat Dissipation by "Epitaxial Film Bonding" Technology," Oki Technical Review, Apr. 2010, pp. 1-6.

John A. Rogers, "A diverse printed future," NATURE, Nov. 2010, pp. 177-178.

Park et al., "Light Emission Characteristics and Mechanics of Foldable Inorganic Light-Emitting Diodes," Advanced Materials, May 2010, pp. 3062-3066.

* cited by examiner

PICKING-UP AND PLACING PROCESS FOR ELECTRONIC DEVICES AND ELECTRONIC MODULE

CROSS-REFERENCE TO RELATED APPLICATION

This application is a continuation-in-part application of and claims the priority benefit of U.S. prior application Ser. No. 14/954,993, filed Nov. 30, 2015, now pending. The prior application Ser. No. 14/954,993 claims the priority benefits of U.S. provisional application Ser. No. 62/085,657, filed on Dec. 1, 2014, Taiwan application serial no. 103143505, filed on Dec. 12, 2014, and Taiwan application serial no. 104121139, filed on Jun. 30, 2015. This application also claims priority benefit of U.S. provisional application Ser. No. 62/291,526, filed on Feb. 5, 2016. The entirety of each of the above-mentioned patent applications is hereby incorporated by reference herein and made a part of this specification.

BACKGROUND OF THE DISCLOSURE

Technical Field

The present disclosure generally relates to a picking-up and placing process for devices and device module, in particular, to a picking-up and placing process for electronic devices and an electronic module.

Description of Related Art

Inorganic light emitting diodes (LEDs) have features of self-luminous, high brightness and so on, and therefore have been widely applied in the fields of illumination, displays, projectors and so forth. Taking monolithic full color micro-LED displays as an example, monolithic micro-displays have been widely used in projectors and faced with a bottleneck of colorizing technology. Generally, in order to obtain different colored lights, epitaxial processes for fabricating a single LED chip including a plurality of light emitting layers capable of emitting different colored lights has already been proposed. Therefore, the single LED chip can provide different colored lights. Since lattice constants of the light emitting layers capable of emitting different colored lights are different, it is difficult to grow such light emitting layers on a same substrate. In addition, another colorizing technology using a LED chip accompanied with different colored wavelength conversion materials has been proposed, wherein the color wavelength conversion materials are excited by the lights emitted from the LED chip and generate the excited lights of different colors. However, the conversion efficiency of the wavelength conversion materials is low and it is difficult to coat the wavelength conversion materials uniformly.

Expect the above two technologies providing different colored lights, a picking-up and placement technique for LED chips is proposed because the LED chips capable of emitting different colored lights may be respectively formed on different substrates to have better epitaxial quality and luminous efficiency. Therefore, the picking-up and placement technique for the LED chips has a better chance to enhance brightness and display quality of a monolithic micro-display significantly. To one ordinary skilled in the art, how to efficiently pick-up and place the LED chips on a circuit substrate of the monolithic micro-display is an important issue. In addition, due to the size of the LED chip is by the microminiaturization, how to make the micro LED capable of emitting light with better collimation is an another important issue.

SUMMARY OF THE DISCLOSURE

One of exemplary embodiments provides a picking-up and placing process for electronic devices, which is capable of placing the electronic devices quickly and efficiently on a target substrate.

One of exemplary embodiments provides an electronic module having the above electronic devices.

One of exemplary embodiments provides a picking-up and placing process for electronic devices, and the picking-up and placing process comprises: forming a plurality of electronic devices arranged in an array on a carrier, wherein a first conductive layer having a conductive pattern is disposed between each of the plurality of electronic devices and the carrier, and a width of the plurality of electronic device is greater than that of the corresponding conductive pattern; selectively picking-up parts of the plurality of electronic devices and corresponding first conductive layers from the carrier via a picking-up and placing module; and placing the parts of plurality of the electronic devices and the corresponding first conductive layers on a target substrate by the picking-up and placing module.

One of exemplary embodiments provides an electronic module, and the electronic module comprises a target substrate, an electronic device and an alloy layer. The electronic device is disposed on the target substrate. The alloy layer is disposed between the target substrate and the electronic device, wherein the alloy layer comprises at least 40% of a low melting point metal, a first melting point of the low melting point metal is lower than 250 degrees Celsius and a second melting point of the alloy layer is higher than 300 degrees Celsius.

The picking-up and placing process for electronic devices of the disclosure comprises a plurality of forming processes for electronic devices, supporting the parts of the first conductive layers through the supporting material layer or the adhesive layer before the electronic devices and the first conductive layers are selectively picked-up from the carrier, and the placing and bonding process for the electronic devices to onto the target substrate. The picking-up and placing process of the disclosure may be suitable for the electronic devices having a size ranging from 1 micro-meter to 100 micro-meters, and the micro electronic devices can be quickly and efficiently picked-up and placed on the target substrate. In addition, the disclosure provides an electronic module having an alloy layer disposed between the target substrate and the electronic device, wherein the alloy layer comprises at least 40% of a low melting point metal, a melting point of the low melting point metal is lower than 250 degrees Celsius and a melting point of the alloy layer is higher than 300 degrees Celsius.

The foregoing will become better understood from a careful reading of a detailed description provided herein below with appropriate reference to the accompanying drawings.

DESCRIPTION OF THE EMBODIMENTS

Figure 1A:
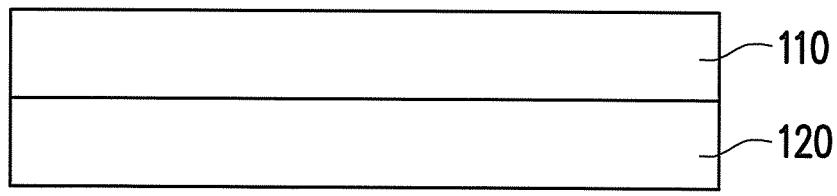
FIG. 1A through FIG. 1N' schematically illustrate cross-sectional views of a picking-up and placing process for electronic devices in accordance with an embodiment of this disclosure.

Below, exemplary embodiments will be described in detail with reference to accompanying drawings so as to be easily realized by a person having ordinary knowledge in the art. The inventive concept may be embodied in various forms without being limited to the exemplary embodiments set forth herein. Descriptions of well-known parts are omitted for clarity, and like reference numerals refer to like elements throughout.

Figure 1B:
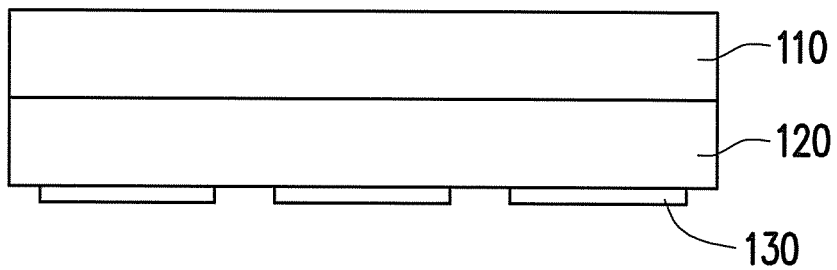
FIG. 1O through FIG. 1Y schematically illustrate top views after having partially removed the supporting material layer between the electronic devices in accordance with another embodiment of this disclosure.
Figure 1C:
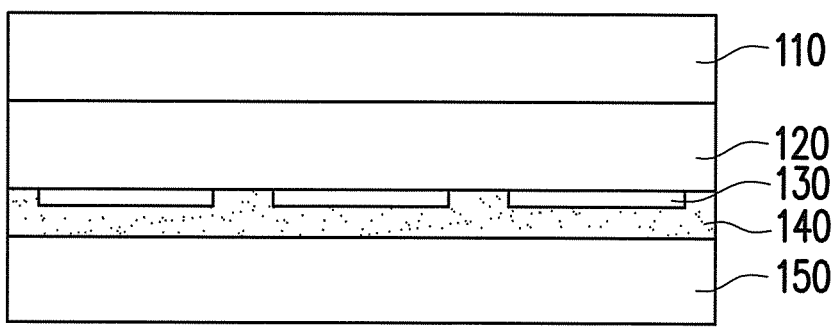
Figure 1D:
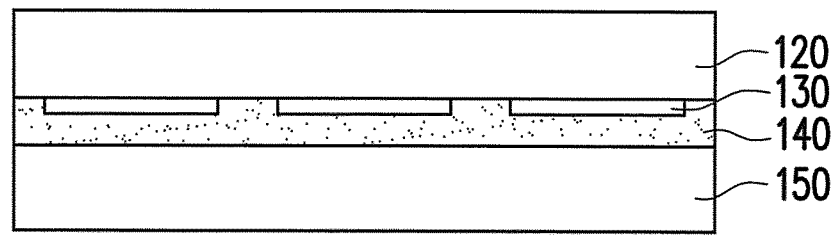
Figure 1E:
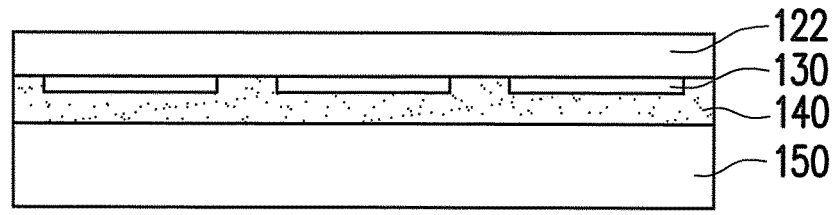
Figure 1F:
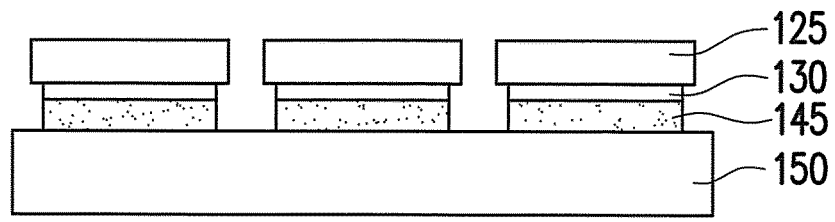
Figure 1G:
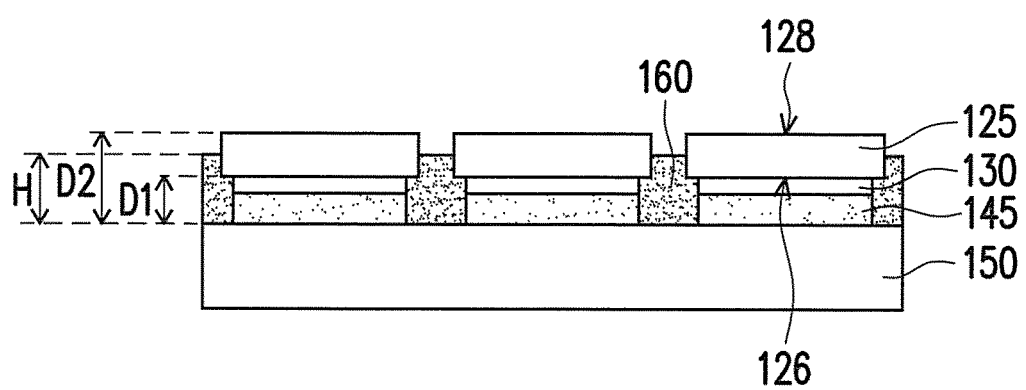
Figure 1H:
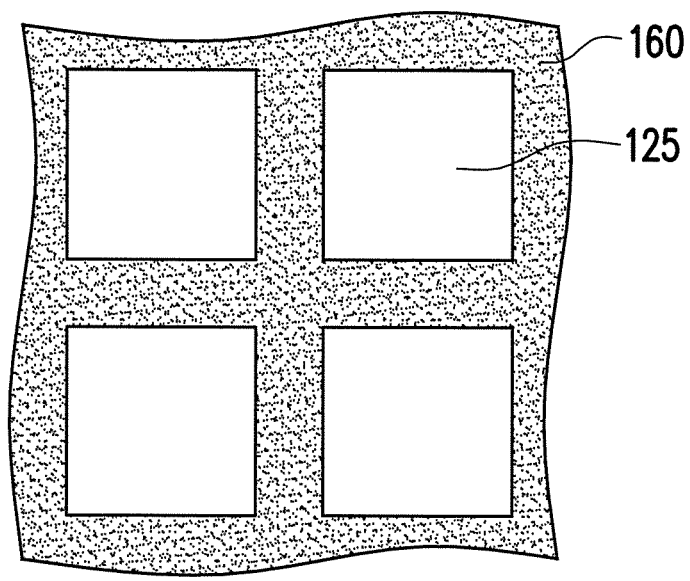
Figure 1I:
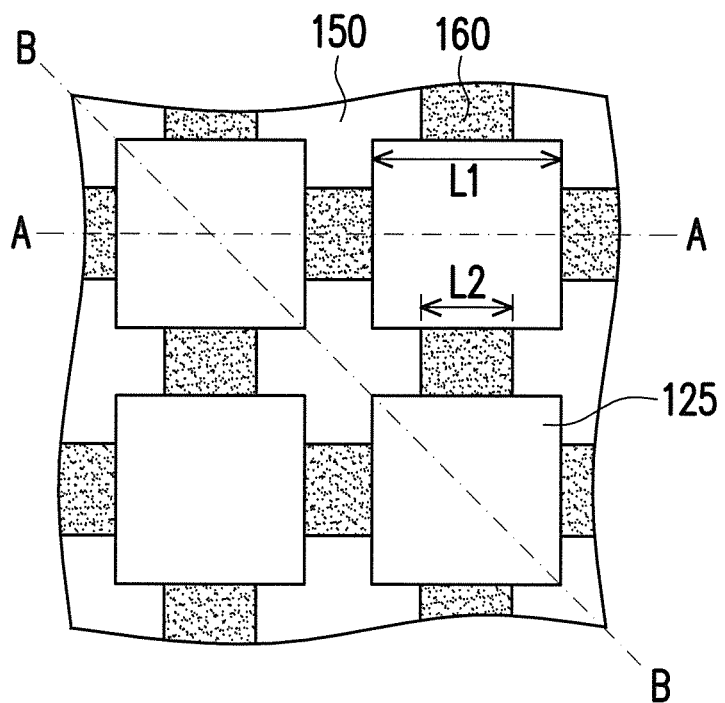
Figure 1J:
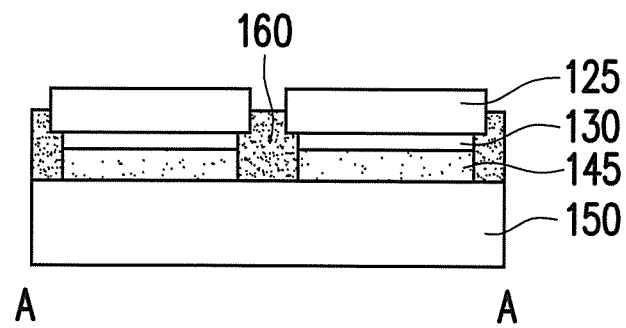
Figure 1K:
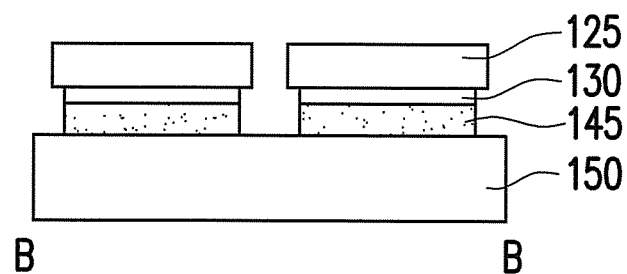
Figure 1L:
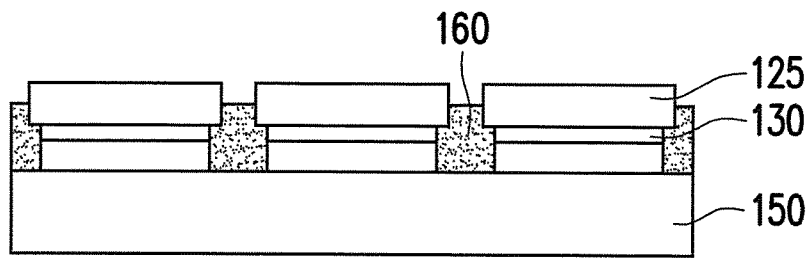
Figure 1M:
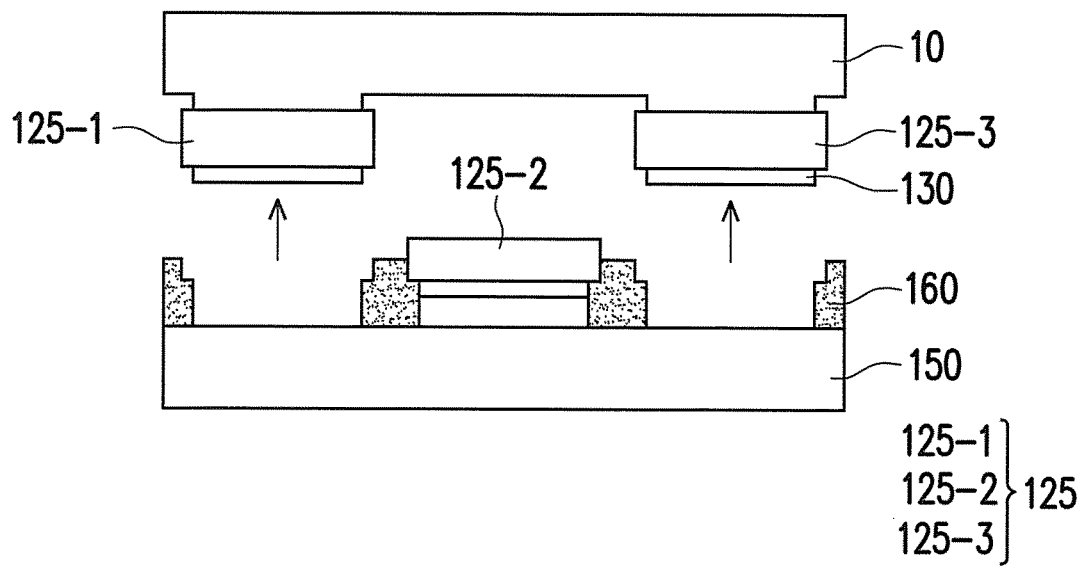
Figure 1N:
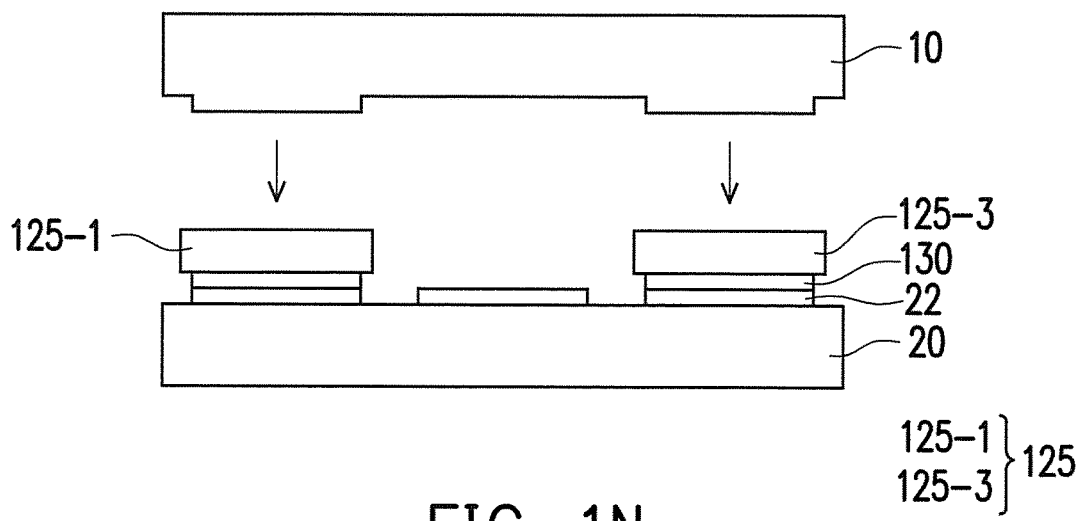
Figure 1N:
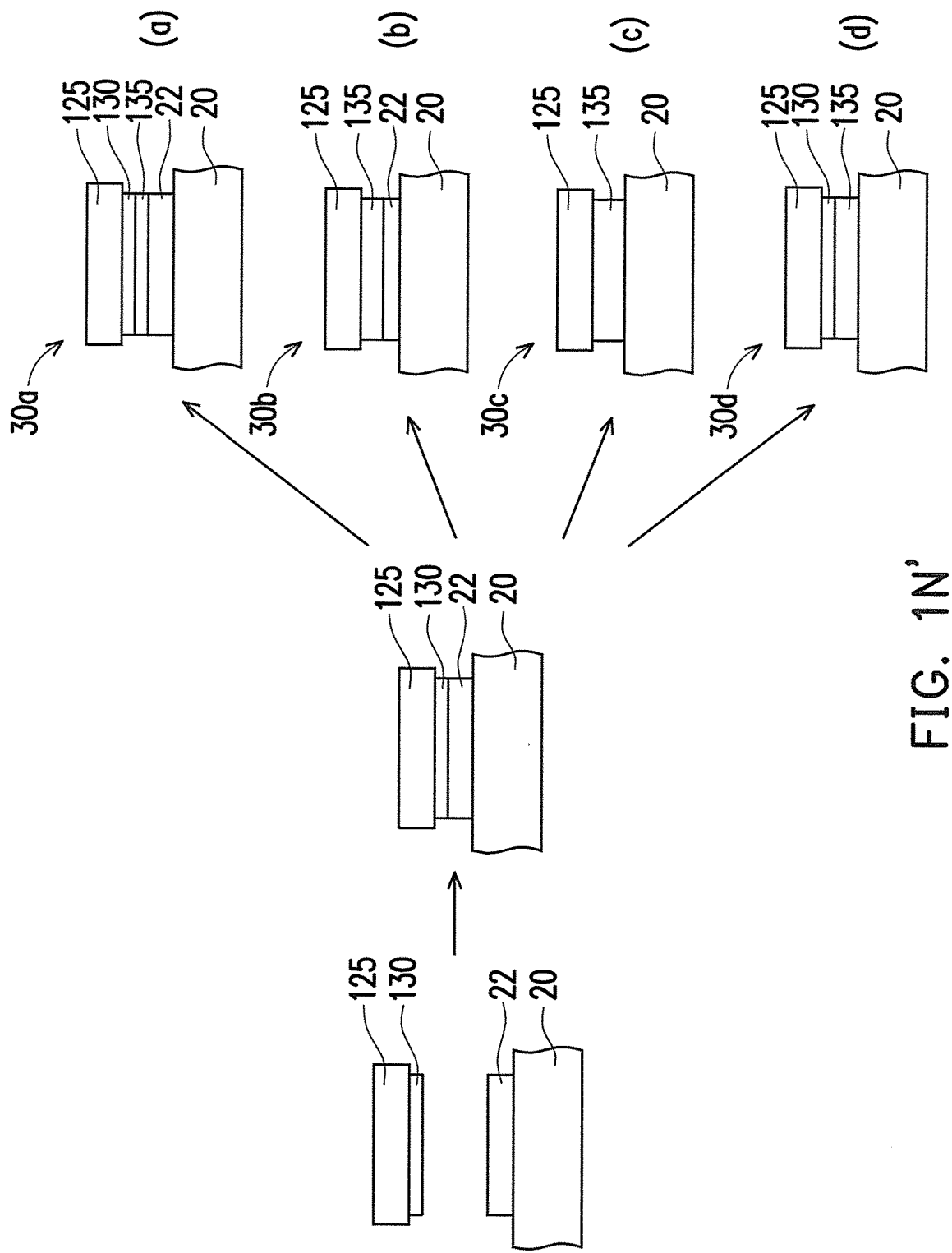

FIG. 1A through FIG. 1N schematically illustrate cross-sectional views of a picking-up and placing process for electronic devices in accordance with an embodiment of this disclosure. The picking-up and placing process for electronic devices comprises the steps of forming a plurality of electronic devices 125 (FIG. 1A through FIG. 1F), the steps of supporting parts of the electronic devices 125 and parts of the first conductive layers 130 through a supporting material layer 160 before the electronic devices 125 and the first conductive layers 130 are selectively picked-up from a carrier 150 (FIG. 1G through FIG. 1L), and the steps of placing the electronic devices 125 and the first conductive layers 130 from the carrier 150 onto a target substrate 20 (FIG. 1M through FIG. 1N). The following will be described in detail.

First of all, the electronic devices 125 are formed by the following steps. Referring to FIG. 1A, a device layer 120 is formed on a growth substrate 110. In this embodiment, the growth substrate 110 is, for example, a silicon substrate, a silicon carbide (SiC) substrate, a sapphire substrate or other suitable substrate. The device layer 120 is, for example, a light-emitting device layer, photo-sensing layer, photovoltaic device layer and so on. The electronic devices 125 is photoelectric devices (for example, light-emitting diodes, photo-detectors, solar cells and so on) or other electric devices irrelevant to light (for example, sensors, transistors and so on). In one exemplary embodiments of this disclosure, the device layer 120 is a light-emitting device layer. The device layer 120 may be a horizontal structure having horizontal electrodes or a vertical structure having vertical electrodes. After the device layer 120 is formed, the electronic devices 125 are arranged in an array.

The device layer 120 is, for example, formed by metal-organic chemical vapour deposition (MOCVD). In other words, the device layer 120 may be an epitaxial layer capable of emitting light when a driving current is applied thereto. Specifically, the device layer 120 may include an n-type doped semiconductor layer, a multiple quantum well (MQW) light-emitting layer and a p-type doped semiconductor layer, wherein the MQW light-emitting layer is sandwiched between the n-type doped semiconductor layer and the p-type doped semiconductor layer. Furthermore, in addition to the n-type doped semiconductor layer, the MQW light-emitting layer and the p-type doped semiconductor layer, the device layer 120 may further include a buffer layer, an n-type cladding layer, a p-type cladding layer, a current blocking layer, a current spreading layer or the combinations thereof. The device layer 120 formed on the growth substrate 110 is only for illustration, other types of semiconductor layers may also be formed on the growth substrate 110.

Referring to FIG. 1B, the first conductive layers 130 are formed on the device layer 120, wherein the position of the first conductive layers 130 formed on the device layer 120 is corresponding to the electronic devices 125. The first conductive layers 130 have magnetic permeability. Specifically, the material of the first conductive layers 130 is, for example, Mu-metal, permalloy, nickel (Ni), iron (Fe) or other suitable metals or alloys having high magnetic permeability. For example, the material of the first conductive layers 130 is nickel, nickel-iron alloy with a ratio of iron 20% and a ratio of nickel 80%, or other suitable ferromagnetic metals having high magnetic permeability. Specifically, the relative permeability of the ferromagnetic metals material is higher than 100.

Referring to FIG. 1C, the device layer 120 and the first conductive layers 130 formed on the growth substrate 110 are bonded with the carrier 150 through an adhesive layer 140. In one of exemplary embodiments of this disclosure, the carrier 150 may be a temporary substrate. The carrier 150 is, for example, a silicon substrate, a silicon carbide (SiC) substrate, a sapphire substrate or other suitable substrate. The material of the adhesive layer 140 is, for example, organic materials, organic polymers, polymers or other suitable materials with proper adhesion. For instance, the material of the adhesive layer 140 is Benzocyclobutene (BCB) and so on. The thickness of the adhesive layer 140 ranges from 1 micro-meter to 10 micro-meters, however, the disclosure is not limited thereto.

Referring to FIG. 1D, the growth substrate 110 is removed to expose an upper surface of the device layer 120. In one of exemplary embodiments of this disclosure, the growth substrate 110 is lift-off from the surface of the device layer 120 by a laser lift-off process, for example. The growth substrate 110 is also lift-off from the surface of the device layer 120 by a mechanical polishing process or a chemical etch process.

Referring to FIG. 1E, after the growth substrate 110 is removed, a thinning process may be optionally performed such that the thickness of the device layer 120 can be reduced and become a thinned device layer 122. After the device layer 120 is thinned, the thickness of the device layer 122 ranges from 100 nm to 5000 nm. In one of exemplary embodiments of this disclosure, the device layer 120 may be thinned by a chemical mechanical polishing (CMP) process, a chemical etch process, a plasma etch process or other suitable processes.

Referring to FIG. 1F, the thinned device layer 122 is patterned to form the electronic devices 125 arranged in an array, and the adhesive layer 140 is patterned to form a plurality of adhesive patterns 145. The adhesive patterns 145 are corresponding to the first conductive layers 130, so that the carrier 150 is partially exposed. In one of exemplary embodiments of this disclosure, the patterning process of the thinned device layer 122 is a photolithography and etching process to form the electronic devices 125. For example, the patterning process is a dry etching process in accompanying with the patterned photoresist layer (not shown) formed on the thinned device layer 122. The thinned device layer 122 is patterned to form the electronic devices 125 arranged in an array. The patterning process of the adhesive layer 140 is also a photolithography and etching process to form the adhesive patterns 145. The process of the adhesive layer 140 is partially removed. However, the disclosure is not limited thereto.

In one of exemplary embodiments of this disclosure, the electronic devices 125 are separated from one another and arranged on the carrier 150 after the thinned device layer 122 is patterned. Referring to FIG. 1F, a width of the electronic devices 125 is greater than that of the corresponding first conductive layers 130. Specifically, the length and width of the electronic devices 125 are respectively ranged from 1 micro-meter to 100 micro-meters. The width of the electronic devices 125 is greater than that of the corresponding first conductive layers 130 about 0.5-4 micro-meter. Such width design may avoid the leakage caused by the condition that the first conductive layers 130 contacts the edge of the electronic devices 125. In addition, the electronic devices 125 are, for example, the LED chips capable of emitting the same colored lights or the photo-sensing chips having the same photographic characteristics. For instance, the electronic devices 125 may be the red LED chips, the green LED chips, the blue LED chips or suitable photo-sensing chips with sensing specific wavelength.

Referring to FIG. 1G, the supporting material layer 160 is formed on the carrier 150 and the supporting material layer 160 is between the electronic devices 125. In one of exemplary embodiments of this disclosure, each of the electronic devices 125 has a first surface 126 facing the carrier 150 and a second surface 128 away from the carrier 150, a height H of the supporting material layer 160 on the carrier 150 is greater than a distance D1 from the first surface 126 to the carrier 150 and less than a distance D2 from the second surface 128 to the carrier 150 when the supporting material layer 160 is formed on the carrier 150 and the supporting material layer 160 surrounds the electronic devices 125, wherein the height H of the supporting material layer 160 on the carrier 150 is greater than that of the first surface 126 about a thickness of (D2−D1)/4 to obtain the corresponding supporting force. FIG. 1H is a top view of FIG. 1G. Referring to FIG. 1H, the supporting material layer 160 is formed on the upper surface of the carrier 150 and between the electronic devices 125.

Referring to FIG. 1I, the supporting material layer 160 between the electronic devices 125 is partially removed. In one of exemplary embodiments of this disclosure, the supporting material layer 160 is patterned by a photolithography and etching process, for example. The patterned supporting material layer 160 is partially in contact with the surrounding of the electronic devices 125 for supporting the electronic devices 125. Specifically, the remaining supporting material layer 160 physically connects the adjacent electronic devices 125, and at least a part of the sidewall of each of the electronic devices 125 is exposed. As shown in FIG. 1I, the remaining supporting material layer 160 extends from the middle edge of one electronic device 125 to the middle edge of another adjacent electronic devices 125. In one of exemplary embodiments of this disclosure, the remaining supporting material layer 160 is symmetrically formed around the electronic devices 125 after the supporting material layer 160 between the electronic devices 125 are partially removed. FIG. 1J is a cross-sectional view along the line A-A' in FIG. 1I. FIG. 1K is a cross-sectional view along the line B-B' in FIG. 1I. As shown in FIG. 1J and FIG. 1K, the remaining supporting material layer 160 still contacts the electronic devices 125 in the cross-sectional view of FIG. 1J. While none of the remaining supporting material layer 160 is between two of the adjacent electronic devices 125 in the cross-sectional view of FIG. 1K. Referring to FIG. 1I, assume that a side length of the electronic devices 125 is L1, and one side of the electronic devices 125 in contact with the supporting material layer 160 is L2. In this exemplary embodiment, total length of one of the electronic devices 125 in contact with the supporting material layer 160 is 4L2, the perimeter of one of the electronic devices 125 is 4L1, therefore, the range of the ratio of 4L2 to 4L1 may go from 0.2 to 0.8, to provide a suitable supporting force and easily to follow the picking-up and placing process for the electronic devices 125.

Referring to FIG. 1L, the adhesive patterns 145 are removed to form a gap between each of the electronic devices 125 and the carrier 150. Since the remaining supporting material layer 160 physically supports the electronic devices 125, the electronic devices 125 does not directly contact with the carrier 150.

Referring to FIG. 1M, parts of the electronic devices 125 and the corresponding first conductive layers 130 are then selectively picked-up from the carrier 150 via a picking-up and placing module 10. In one of exemplary embodiments of this disclosure, the first conductive layers 130 have the magnetic permeability, the parts of the electronic devices 125 and the corresponding first conductive layers 130 are picked-up from the carrier 150 by a way of magnetic force generated from the picking-up and placing module 10. The magnetic force generated from the picking-up and placing module 10 is relevant to the first conductive layers 130. The magnetic force between picking-up and placing module 10 and the first conductive layers 130 must be greater than sum of the weight of one of the electronic device 125, the first conductive layers 130 to be picked up and the connection force provided by the remaining supporting material layer 160. In this way, the electronic devices 125 and the first conductive layers 130 can be separated from the carrier 150 and can be picked-up by the magnetic force generated from the picking-up and placing module 10.

In other one of exemplary embodiments of this disclosure, the first conductive layers 130 may not have the magnetic permeability, the parts of the electronic devices 125 and the corresponding first conductive layers 130 are picked-up from the carrier 150 via a vacuum force or a static electricity force generated from the picking-up and placing module 10. In addition, as shown in FIG. 1M, the picking-up and placing module 10 comprises a plurality of downward bumps distributed at the positions corresponding to the parts of the electronic devices 125 to be selectively picked-up. For example, the two of the electronic devices 125-1 and 125-3.

This may avoid the other portion of the picking-up and placing module 10 to hit or contact the unselected electronic devices 125 (for example, the electronic devices 125-2), during the picking-up process for the electronic devices 125.

Referring to FIG. 1N, the parts of the electronic devices 125 and the corresponding first conductive layers 130 picked-up by the picking-up and placing module 10 are placed on and bonded with the target substrate 20. In one of exemplary embodiments of this disclosure, the target substrate 20 may be, for example, a circuit substrate of monolithic micro-displays for carrying the LED chip or a circuit substrate for carrying the photo-sensing chip. In one of exemplary embodiments of this disclosure, the target substrate 20 includes a plurality of second conductive layers 22 arranged in an array and formed thereon. The first conductive layers 130 comprise a metal layer and the second conductive layers 22 are metal layers. The parts of the electronic devices 125 picked-up by the picking-up and placing module 10 are placed on and bonded with parts of the second conductive layers 22 through corresponding first conductive layers 130. For instance, the second conductive layers 22 may be pads or bumps.

FIG. 1N' schematically illustrate a view of the parts of the electronic devices 125 and the corresponding first conductive layers 130 are placed on and bonded with the target substrate 20 through the second conductive layers 22. Referring to FIG. 1N', in one of exemplary embodiments of this disclosure, the first conductive layers 130 can be bonded with the second conductive layers 22 by a way of a low-temperature bonding. The purposes of performing the low-temperature bonding are as below. Firstly, one of the metal or the alloy has a low melting point, therefore, the bonding process can be maintained in a low heating temperature which may reduce the oxidation of the metal during the bonding process. Secondly, the metal or the alloy having a low melting point has less hardness, therefore, less pressure is applied to the electronic devices 125 during the bonding process, and the electronic devices 125 will not be damaged by the applied pressure easily. Thirdly, the bonding process can be performed easily and simply through the low heating temperature and the lower pressure.

In other words, one of the first conductive layers 130 and the second conductive layers 22 may comprise the material of the metal or the alloy having a melting point lower than 250 degrees Celsius, and the other one may comprise the material of the metal or the alloy having a melting point higher than 250 degrees Celsius. Specifically, the low melting point metal or alloy having the melting point lower than 250 degrees Celsius may comprises In (with melting point of 156 degrees), Sn (with melting point of 231 degrees), InAg (with a ratio of In higher than 0.85), InAu (with a ratio of In higher than 0.95), InSn and InCu (with a ratio of In higher than 0.95), SnAg (with a ratio of Sn higher than 0.9), SnAu (with a ratio of Sn higher than 0.85) or SnCu (with a ratio of Sn higher than 0.95). The high melting point metal or alloy having the melting point higher than 250 degrees Celsius may comprise Ag (with melting point of 961 degrees), Au (with melting point of 1064 degrees) or Cu (with melting point of 1084 degrees).

In one of exemplary embodiments of this disclosure, for instance, the first conductive layers 130 may comprise the material of the metal or the alloy having a melting point lower than 250 degrees Celsius. The second conductive layers 22 may comprise the material of the metal or the alloy having a melting point higher than 250 degrees Celsius. As shown in FIG. 1N', four electronic devices 30a, 30b, 30c and 30d are formed after applying a low-temperature bonding on the first conductive layers 130 and the second conductive layers 22 under a bonding temperature lower than 250 degrees Celsius.

As shown in the first electronic device 30a of FIG. 1N', after the first conductive layers 130 are melted, the first conductive layers 130 will diffuse towards the second conductive layers 22, so that an alloy layer 135 is formed between the first conductive layers 130 and the second conductive layers 22. As shown in the second electronic device 30b of FIG. 1N', an alloy layer 135 is formed by the second conductive layers 22 and the entire first conductive layers 130. Parts of the second conductive layers 22 may be left under the alloy layer 135 since the second conductive layers 22 has a greater thickness. As shown in the third electronic device 30c of FIG. 1N', when the second conductive layers 22 has a less thickness, the first conductive layers 130 can react with the entire second conductive layers 22, therefore, only the alloy layer 135 is left between the electronic devices 125 and the target substrate 20 after the first conductive layers 130 and the entire second conductive layers 22 are bonded. As shown in the fourth electronic device 30d of FIG. 1N', when the second conductive layers 22 has a less thickness and the first conductive layers 130 has a greater thickness, parts of the first conductive layers 130 can react with the entire second conductive layers 22, therefore, the alloy layer 135 and the remaining first conductive layers 130 are formed between the electronic devices 125 and the target substrate 20 after the parts of the first conductive layers 130 and the entire second conductive layers 22 are bonded.

It is noted that the alloy layer 135 is a metal layer having a melting point higher than 300 degrees Celsius. The material of the alloy layer 135 comprises at least one binary system, for example, InAg, InAu, InSn, InCu, SnAg, SnAu, SnCu and so on, or at least one ternary system, for example, InSnAg, InSnAu, InSnCu, InAuAg, InAuCu, InAgCu, SnAgAu, SnAgCu, SnAuCu and so on. The alloy layer 135 comprises at least 40% of a metal or alloy of low melting point, and a melting point of the low melting point metal or alloy is lower than 250 degrees Celsius. In one of exemplary embodiments of this disclosure, the alloy layer 135 comprises at least 50% of a metal or alloy of low melting point, and the melting point of the low melting point metal or alloy is lower than 250 degrees Celsius. In addition, the connection force between the electronic devices 125 and the second conductive layers 22 on the target substrate 20 is greater than the magnetic force generated from the picking-up and placing module 10 relevant to the first conductive layers 130. In this way, the electronic devices 125 and the first conductive layers 130 can be placed on and bonded with the target substrate 20. The second conductive layers 22 have magnetic permeability such that the first conductive layers 130 bonded with the second conductive layers 22 can be aligned without offset during the bonding process. The material of the second conductive layers 22 is, for example, Mu-metal, permalloy, nickel (Ni), ferro (Fe) or other suitable metals having high magnetic permeability. For instance, the material of the second conductive layers 22 is Ni, Ni—Fe alloy with 20% of Fe and 80% of Ni, or other suitable ferromagnetic metals having high magnetic permeability. Specifically, the relative permeability of the ferromagnetic metals is higher than 100.

After the electronic devices 125 is picked-up and bonded with the target substrate 20, the process of FIG. 1A through FIG. 1N may be repeated so that other electronic devices can be picked-up and bonded at other position of the target substrate 20. The other electronic devices are, for example, the LED chips capable of emitting the different colored lights or the photo-sensing chips having different photographic characteristics. The fabricated pixel units may emit the red lights, the green lights and the blue lights on the target substrate 20.

After the supporting material layer 160 between the electronic devices 125 is partially removed, the pattern types of the patterned supporting material layer 160 are not limited to the pattern type shown in FIG. 1I. The supporting material layer 160 is partially removed to expose a part of the adhesive patterns 145 such that the part of the adhesive patterns 145 can be removed. FIG. 1O through FIG. 1Y schematically illustrate top views after the supporting material layer between the electronic devices are partially removed in accordance with another embodiment of this disclosure.

Figure 1O:
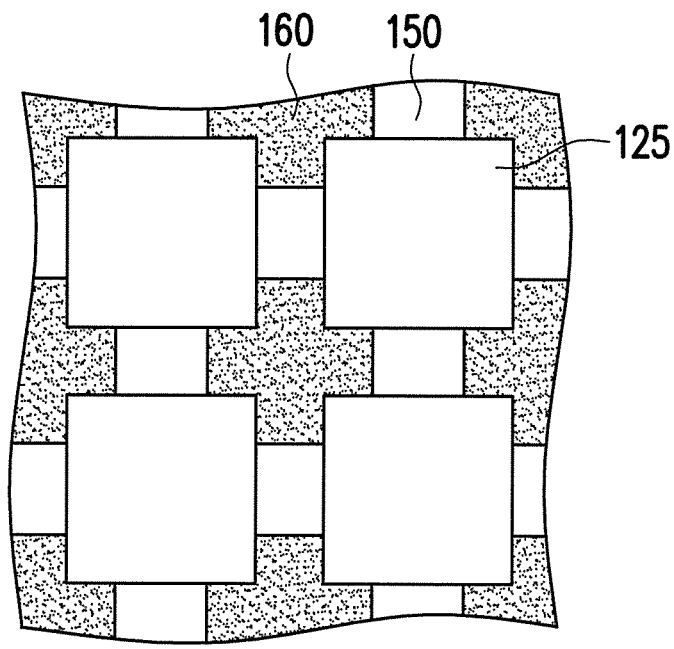
Figure 1P:
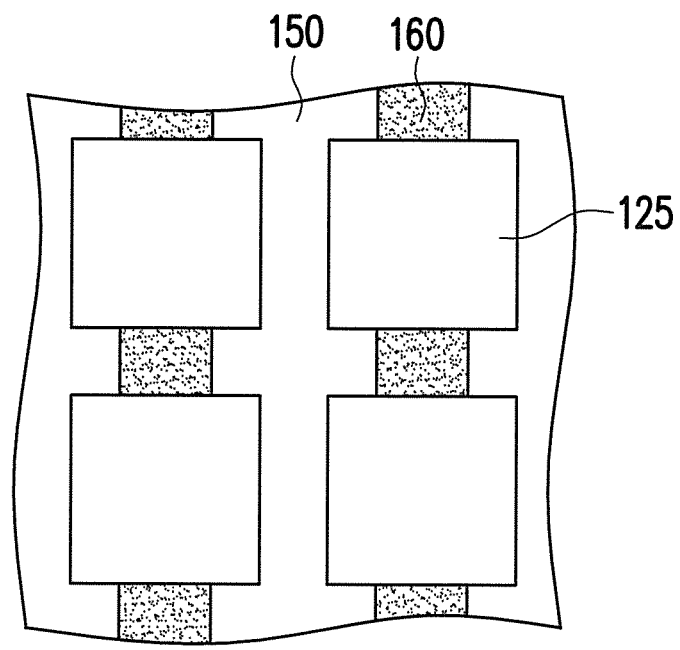
Figure 1Q:
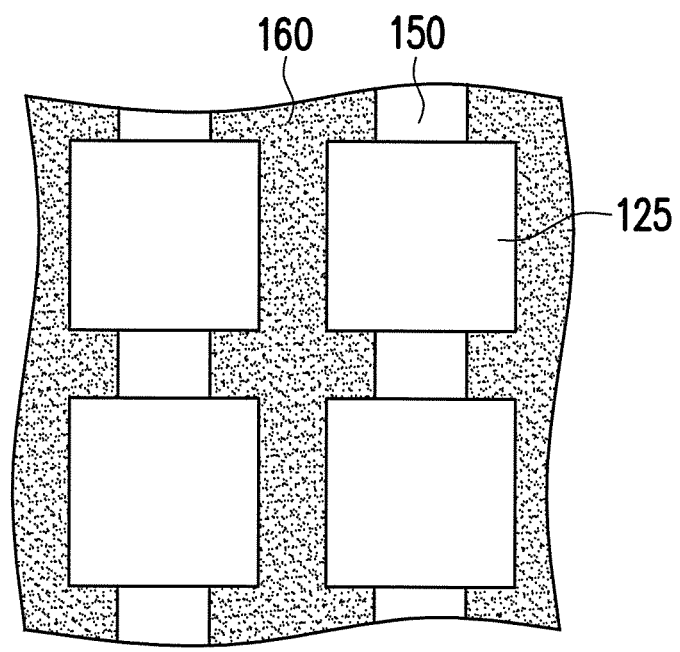
Figure 1R:
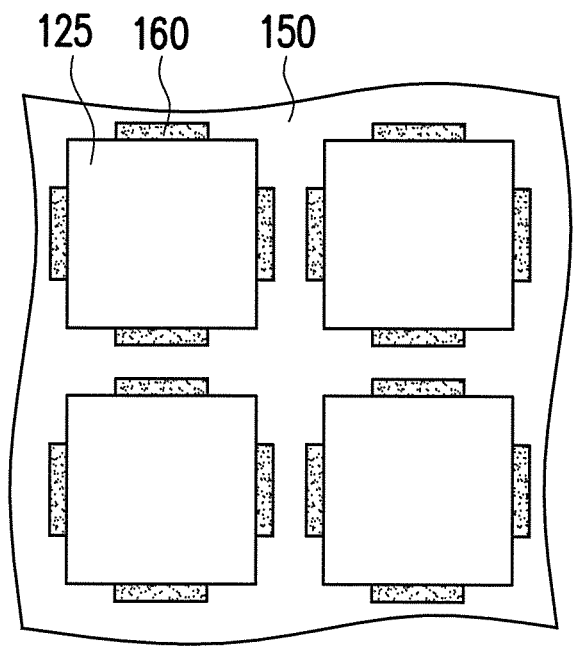
Figure 1S:
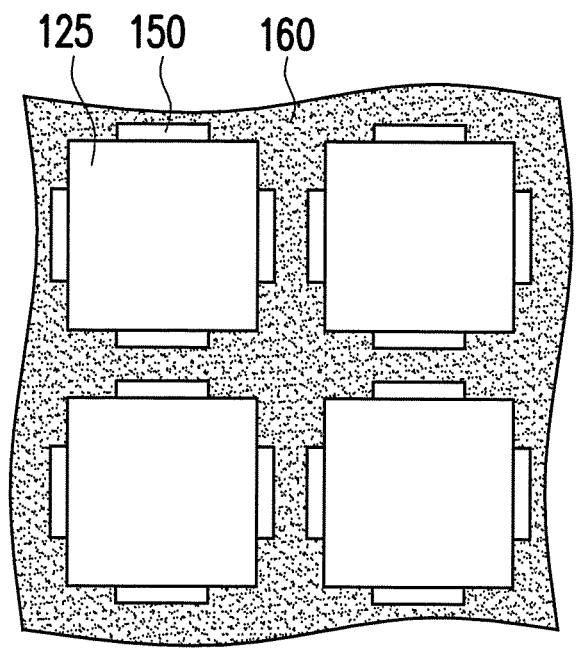
Figure 1T:
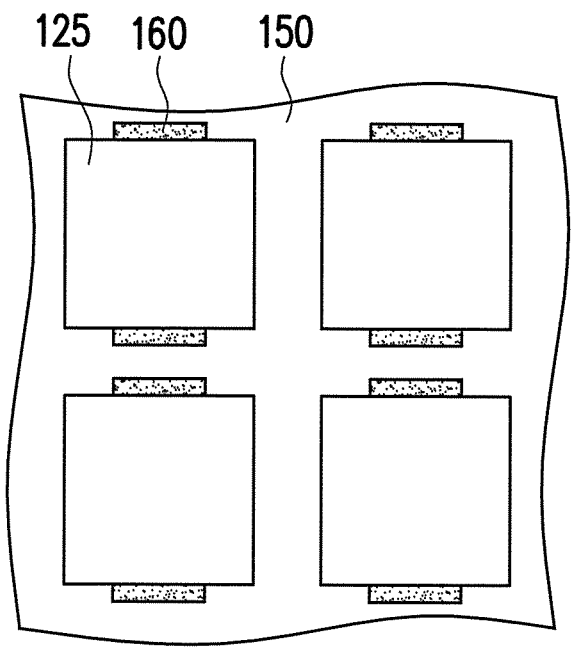
Figure 1U:
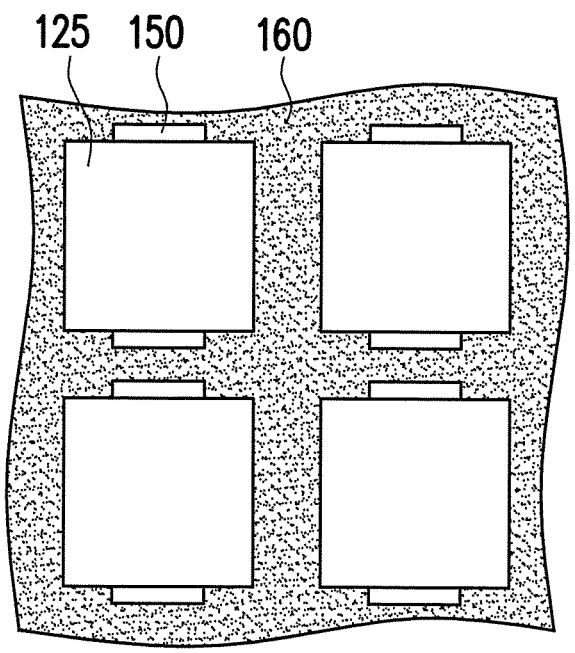
Figure 1V:
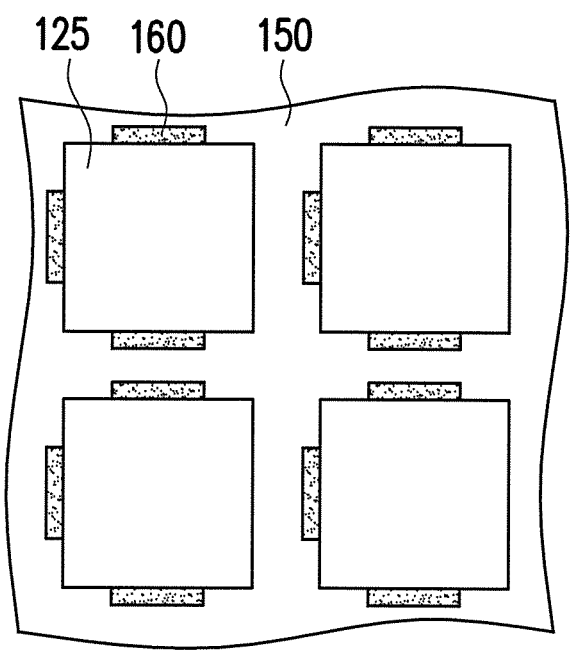
Figure 1W:
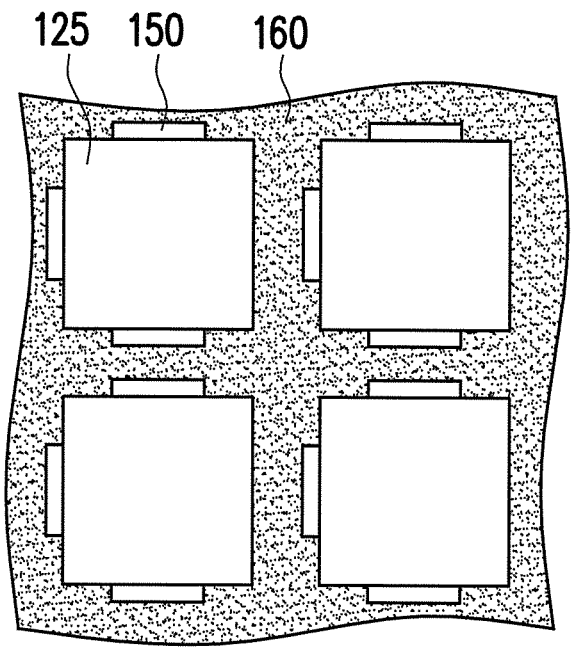
Figure 1X:
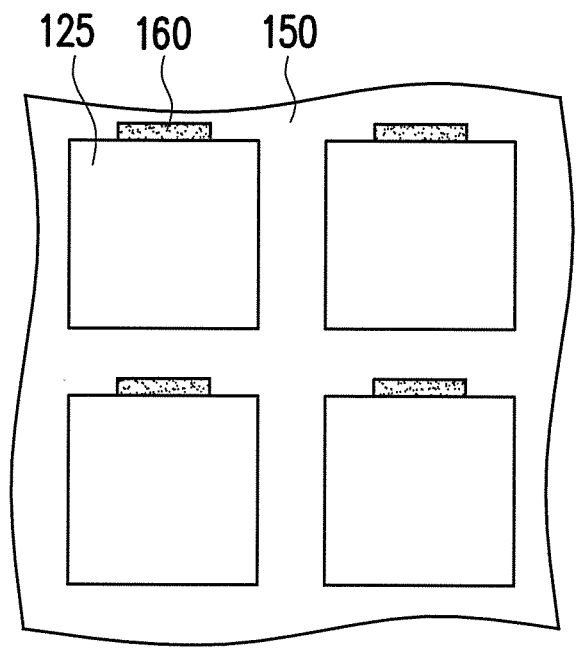
Figure 1Y:
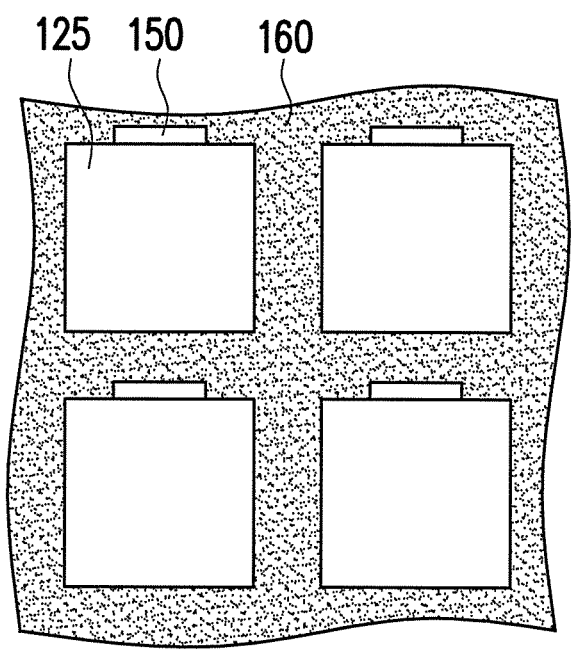

As shown in FIG. 1O through FIG. 1Y, the pattern type of the remaining supporting material layer 160 on the carrier 150 shown in FIG. 1O is a reverse of the pattern type of the remaining supporting material layer 160 on the carrier 150 shown in FIG. 1I. In FIG. 1P, the remaining supporting material layer 160 on the carrier 150 only connects two opposite surfaces of each of the electronic devices 125. The pattern type of the remaining supporting material layer 160 shown in FIG. 1Q is a reverse of the pattern type of the remaining supporting material layer 160 shown in FIG. 1P. In FIG. 1P and FIG. 1T, the remaining supporting material layer 160 between two adjacent electronic devices 125 doesn't connect to each other. The two pattern types of the remaining supporting material layer 160 shown in FIG. 1S and FIG. 1U, respectively are two corresponding reverses of the pattern types of the remaining supporting material layer 160 shown in FIG. 1R and FIG. 1T, respectively. As shown in FIG. 1V and FIG. 1Y, the remaining supporting material layer 160 may be asymmetrically formed around the electronic devices 125.

In one of exemplary embodiments of a picking-up and placing process for electronic devices, the process of FIG. 2A through FIG. 2F may be continuously performed after the processes of FIG. 1A through FIG. 1G. FIG. 2A through FIG. 2F schematically illustrate cross-sectional views of a picking-up and placing process for electronic devices in accordance with another embodiment of this disclosure. In the following embodiments of the disclosure, the same reference numbers are used in the drawings and the description to refer to the same or like parts.

Figure 2A:
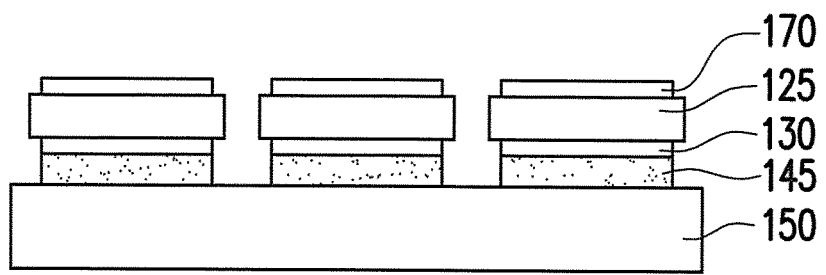
FIG. 2A through FIG. 2F schematically illustrate cross-sectional views of a picking-up and placing process for electronic devices in accordance with another embodiment of this disclosure.
Figure 2B:
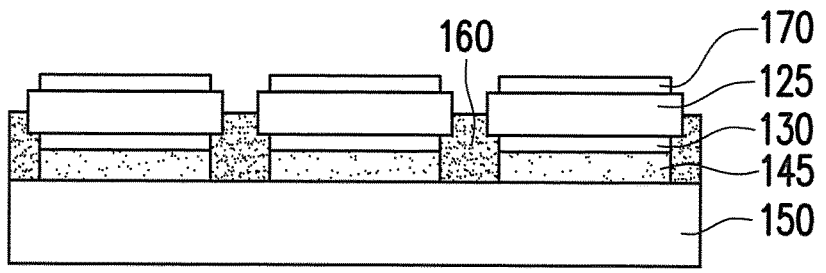
Figure 2C:
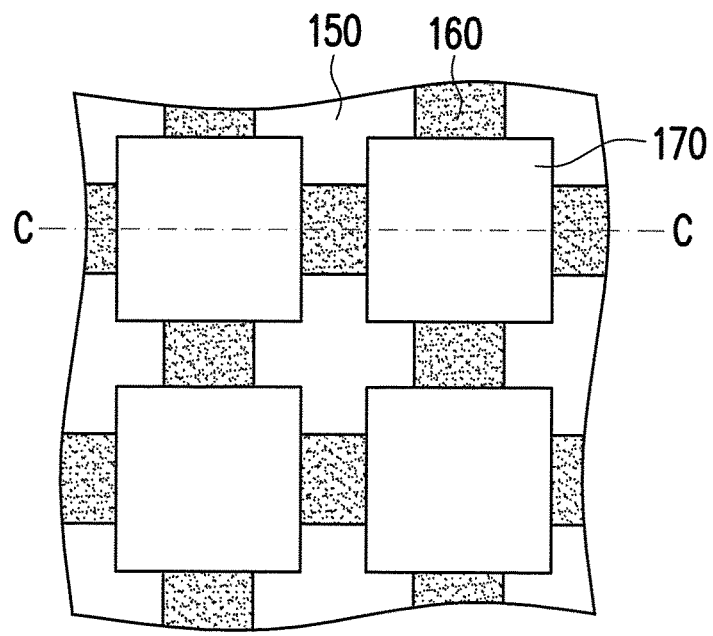
Figure 2D:
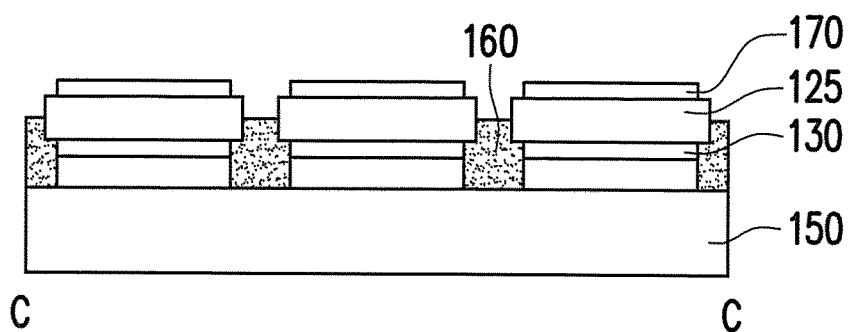
Figure 2E:
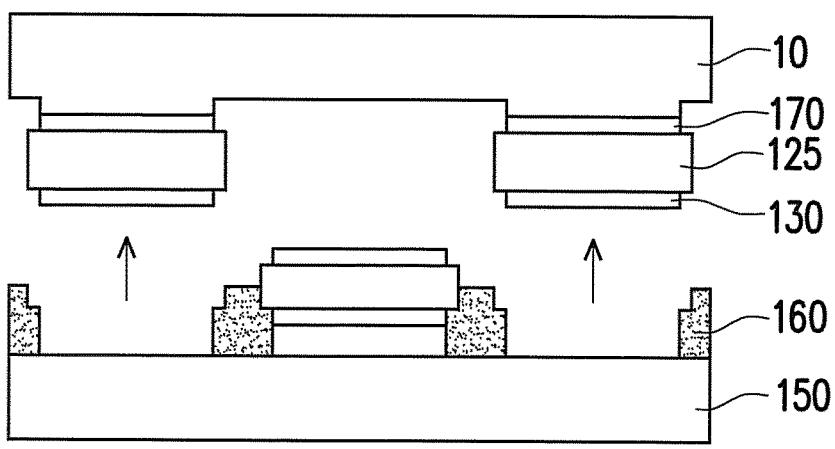
Figure 2F:
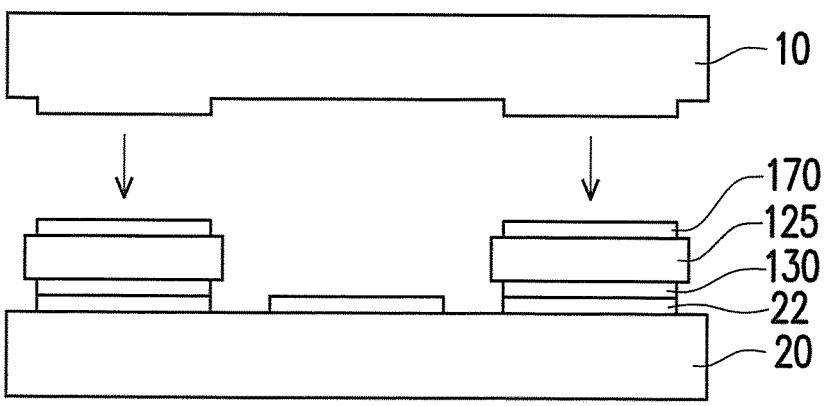

As shown in the embodiment of FIG. 2A, after the electronic devices 125 are formed and arranged in an array on the carrier 150, a third conductive layer 170 is further formed on each of the electronic devices 125, wherein each of the electronic devices 125 is disposed between the first conductive layer 130 and the third conductive layer 170.

The processes of FIG. 2B through FIG. 2F in accordance with this embodiment are similar to the processes of FIG. 1G, FIG. 1I, FIG. 1L, FIG. 1M and FIG. 1N. The supporting material layer 160 is disposed on the carrier 150 at the position other than that of the first conductive layers 130. Then, the supporting material layer 160 is patterned. The adhesive patterns 145 are removed. The parts of the electronic devices 125, the corresponding first conductive layers 130 and the corresponding third conductive layers 170 are picked-up and placed on the target substrate 20 by the picking-up and placing module 10.

It is noted that at least one of each first conductive layer 130 and each corresponding third conductive layer 170 has magnetic permeability. The parts of the electronic devices 125, the corresponding first conductive layers 130 and the corresponding third conductive layers 170 are picked-up via the magnetic force generated from the picking-up and placing module 10. If both the first conductive layers 130 and the corresponding third conductive layers 170 have magnetic permeability, more magnetic force generated from the picking-up and placing module 10 is relevant to the electronic devices 125, the corresponding first conductive layers 130 and the corresponding third conductive layers 170. Certainly, if the electronic devices 125 are picked-up via none of the magnetic force generated from the picking-up and placing module 10, the first conductive layers 130 and the corresponding third conductive layers 170 may have no magnetic permeability.

Figure 3A:
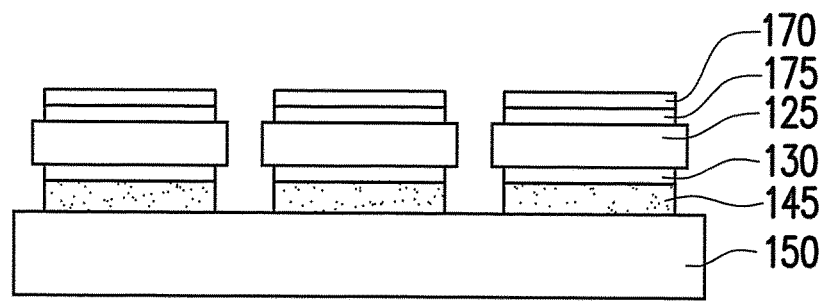
FIG. 3A through FIG. 3G schematically illustrate cross-sectional views of a picking-up and placing process for electronic devices in accordance with yet another embodiment of this disclosure.
Figure 3B:
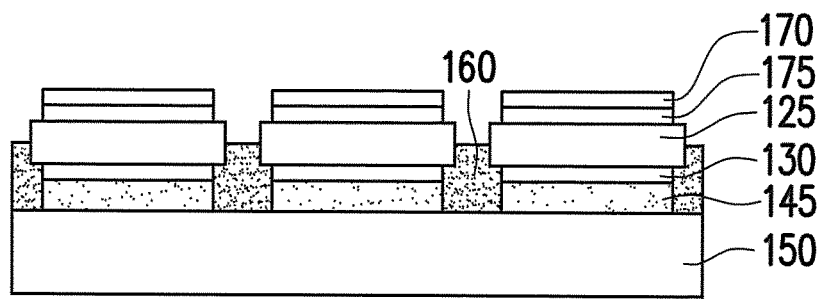
Figure 3C:
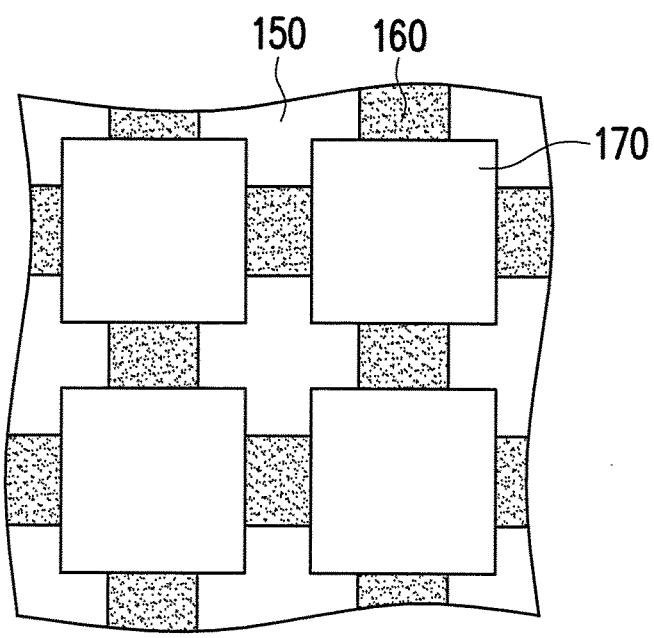
Figure 3D:
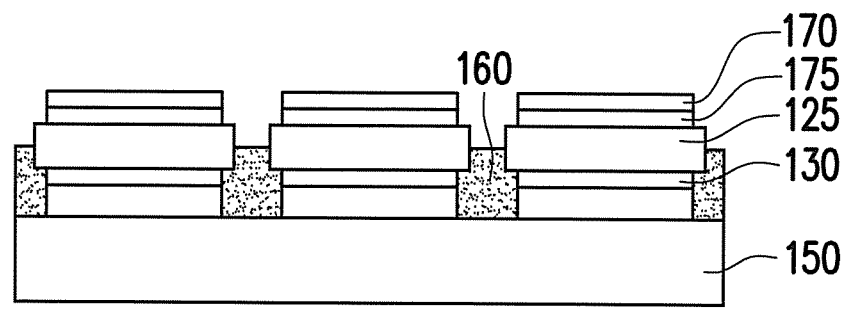
Figure 3E:
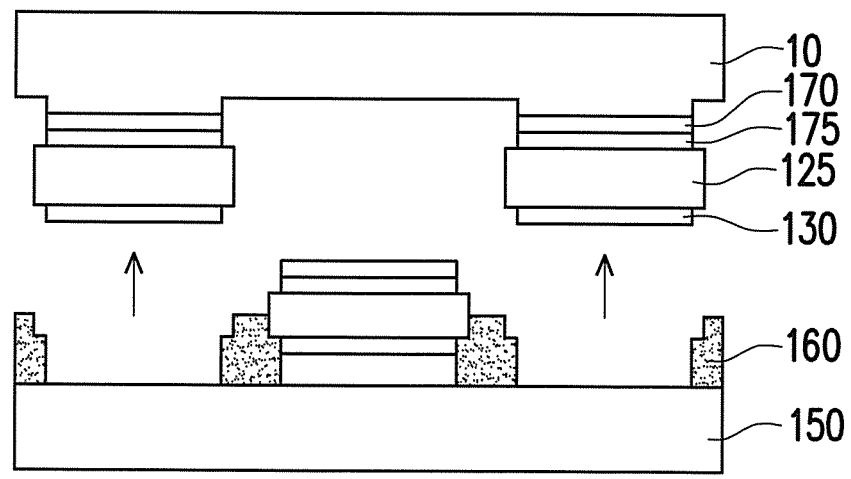
Figure 3F:
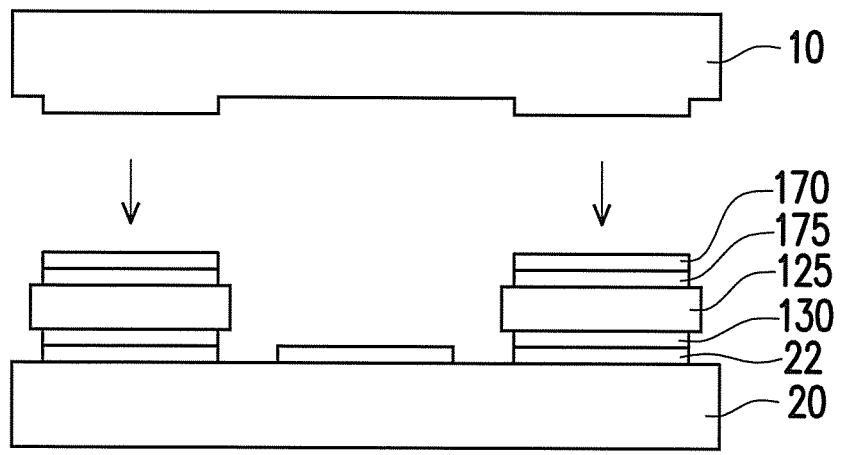

FIG. 3A through FIG. 3G schematically illustrate cross-sectional views of a picking-up and placing process for electronic devices in accordance with yet another embodiment of this disclosure. One of main differences between the processes of FIG. 3A through FIG. 3F and the processes of FIG. 2A through FIG. 2F is a sacrificial layer 175 is formed on each of the electronic devices 125 before the third conductive layer 170 is formed on the corresponding electronic devices 125, as shown in FIG. 3A. In one of exemplary embodiments of this disclosure, the sacrificial layer 175 is disposed between each of the third conductive layer 170 and the corresponding electronic devices 125 after the third conductive layer 170 is formed on the electronic devices 125. The material of the sacrificial layer 175 is, for example, dielectric materials of silicon dioxide, silicon nitride, zinc oxide and so on, or semiconductor materials of AlGaN, AlInN and so on, or materials of organic polymers.

The processes of FIG. 3B through FIG. 3F are similar to the processes of FIG. 2B through FIG. 2F. The supporting material layer 160 is disposed on the carrier 150 at a position other than that of the first conductive layers 130. Then, the supporting material layer 160 is patterned. The adhesive patterns 145 are removed. The parts of the electronic devices 125, the corresponding first conductive layers 130, the corresponding sacrificial layer 175 and the corresponding third conductive layers 170 are picked-up and placed on the target substrate 20 by the picking-up and placing module 10.

Figure 3G:
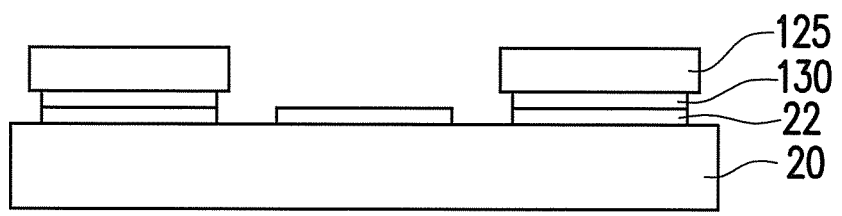

After the parts of the electronic devices 125, the corresponding first conductive layers 130, the corresponding sacrificial layer 175 and the corresponding third conductive layers 170 are picked-up and placed on the target substrate 20, and the sacrificial layers 175 and the third conductive layers 170 disposed on the target substrate 20 are removed, as shown in FIG. 3G. Specifically, the third conductive layers 170 are separated from the electronic devices 125 by removing the sacrificial layers 175.

In one of exemplary embodiments of this disclosure, the sacrificial layers 175 are removed by a wet chemical etch process, a heating process, a laser irradiation process and so on. However, the disclosure is not limited thereto. Specifically, the sacrificial layers 175 are dissolved by a wet etch process such that the third conductive layers 170 are easily separated from the electronic devices 125. For instance, if the material of the sacrificial layer 175 is dielectric materials such as silicon dioxide, silicon nitride, zinc oxide and so on, the etchant is phosphoric acid ($H_3PO_4$), hydrochloric acid (HCl) or other kinds of acidic solution. If the material of the sacrificial layer 175 is semiconductor materials such as AlGaN, AlInN and so on, the etchant is potassium hydroxide (KOH), nitric acid ($HNO_3$) or other kinds of solution. If the material of the sacrificial layer 175 is organic polymers, the etchant is acetone (ACE), N-Methylpyrrolidone (NMP) or other kinds of organic solution. If the material of the sacrificial layer 175 is adhesive material, the stickiness of the sacrificial layers 175 is reduced by the heating process such that the third conductive layers 170 are easily separated from the electronic devices 125.

Figure 4A:
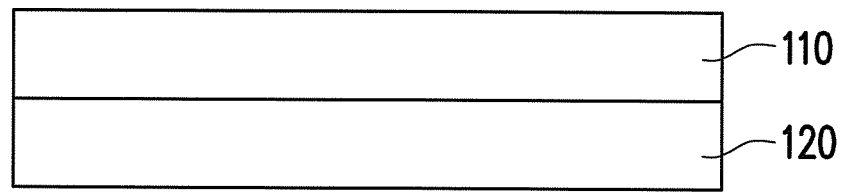
FIG. 4A through FIG. 4F schematically illustrate cross-sectional views of a forming process for electronic devices in accordance with another embodiment of this disclosure.
Figure 4B:
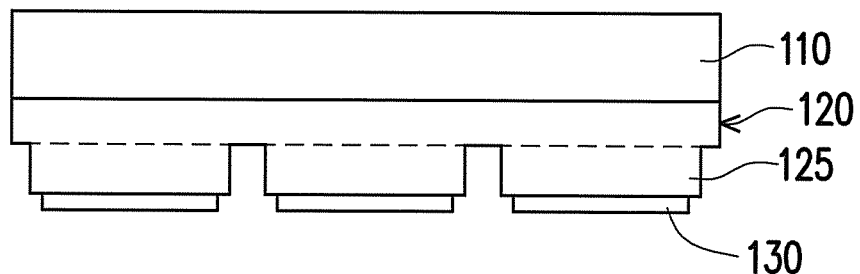
Figure 4C:
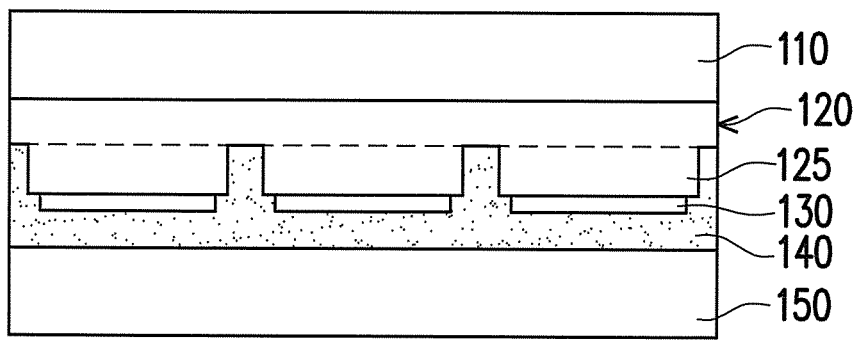
Figure 4D:
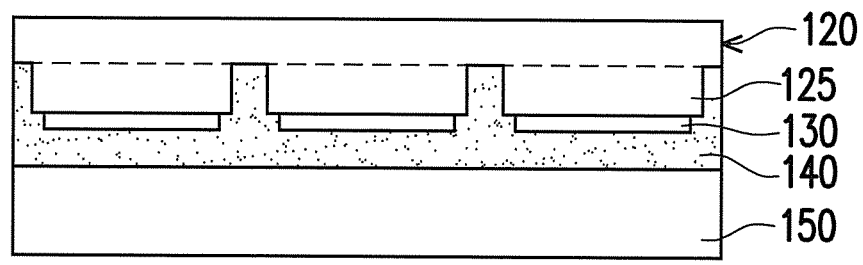
Figure 4E:
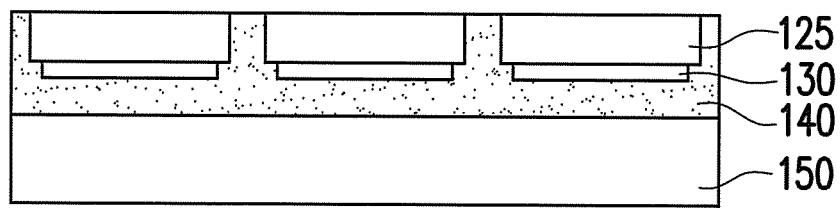
Figure 4F:
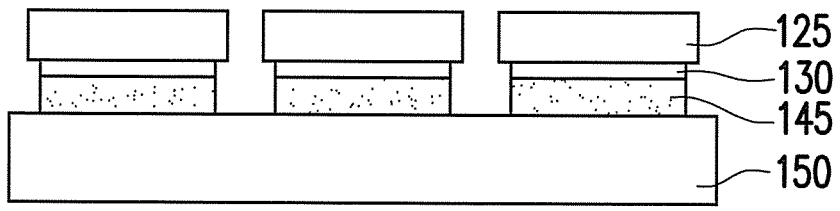

It is worth noted that the forming process for the electronic devices 125 is not limited to FIG. 1A through FIG. 1F. FIG. 4A through FIG. 4F schematically illustrate cross-sectional views of a forming process for electronic devices in accordance with another embodiment of this disclosure. As shown in FIG. 4A, the same as FIG. 1A, the device layer 120 is formed on the growth substrate 110. As shown in FIG. 4B, the device layer 120 is patterned to form the electronic devices 125 arranged in an array. In the embodiment of this disclosure, the electronic devices 125 still connect to one another and are arranged on the growth substrate 110 after the device layer 120 is patterned. Then, the first conductive layers 130 are formed on and corresponding to the electronic devices 125.

It is noted that the device layer 120 is etched only up to the depth of forming the electronic devices 125. In other one of exemplary embodiments of this disclosure, the depth that the device layer 120 is patterned may be the thickness of the device layer 120. In other words, the device layer 120 is patterned to partially expose the growth substrate 110 such that the electronic devices 125 are separated from one another and arranged on the growth substrate 110.

Referring to FIG. 4C through FIG. 4F, the patterned device layer 120 and the first conductive layers 130 formed on the growth substrate 110 are bonded with the carrier 150 through the adhesive layer 140. The growth substrate 110 is removed. Then, a thinning process may be optionally performed for the remaining device layer 120 such that the electronic devices 125 are separated from one another. The adhesive layer 140 is patterned to form the adhesive patterns 145 corresponding to the first conductive layers 130, and to partially expose the carrier 150. The processes of FIG. 1G through FIG. 1N may be continuously performed to form the supporting material layer 160, pattern the supporting material layer 160, and pick-up and place the electronic devices 125 on the target substrate 20.

Figure 5A:
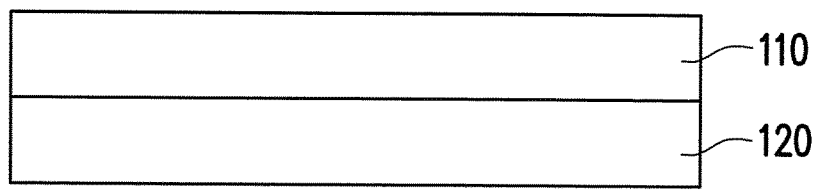
FIG. 5A through FIG. 5J schematically illustrate cross-sectional views of a picking-up and placing process for electronic devices in accordance with yet another embodiment of this disclosure.
Figure 5B:
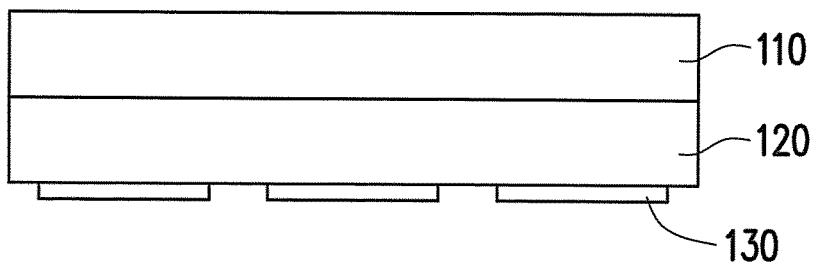
Figure 5C:
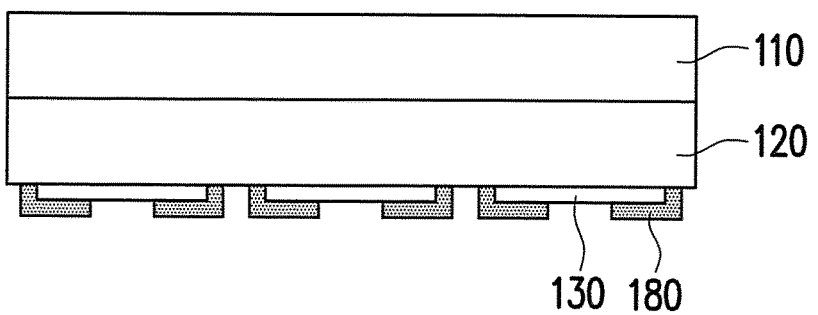
Figure 5D:
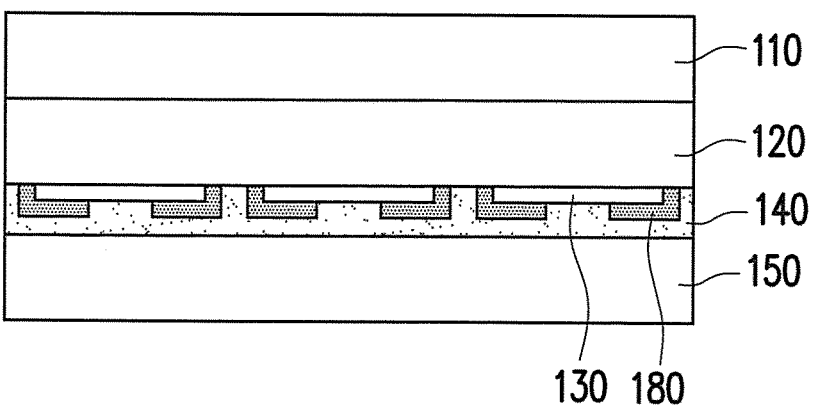
Figure 5E:
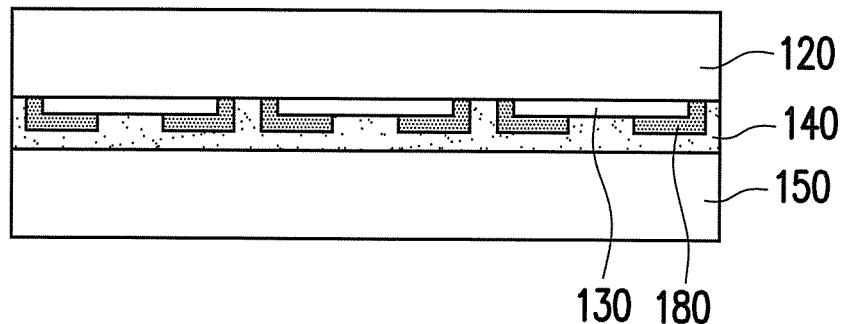
Figure 5F:
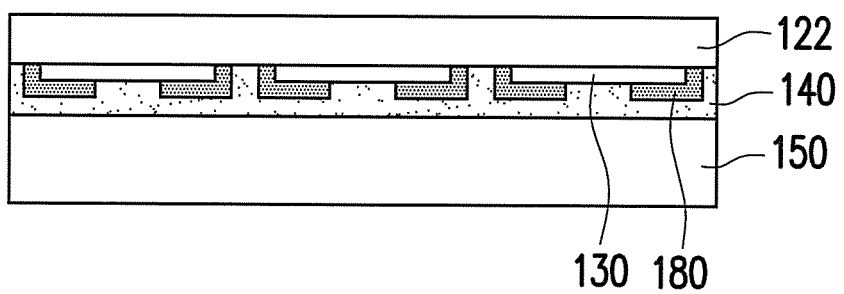
Figure 5G:
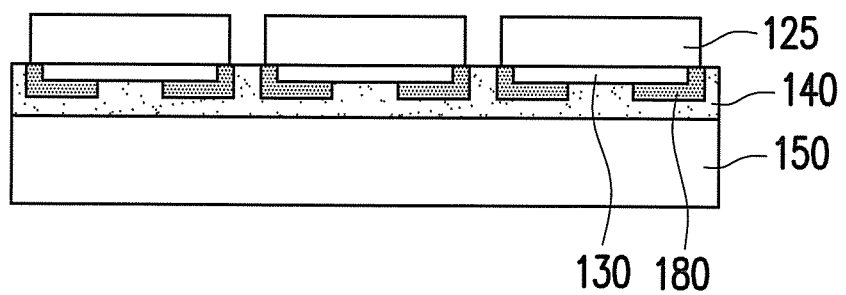

FIG. 5A through FIG. 5J schematically illustrate cross-sectional views of a picking-up and placing process for electronic devices in accordance with yet another embodiment of this disclosure. Referring to FIG. 5A through FIG. 5J, the processes of FIG. 5A and FIG. 5B are the same as the processes of FIG. 1A and FIG. 1B. First of all, the device layer 120 is formed on the growth substrate 110 and then the first conductive layers 130 are formed on the device layer 120. As shown in FIG. 5C, a plurality of removable material layers 180 are formed on the device layer 120 and in contact with the first conductive layers 130. In one of exemplary embodiments of this disclosure, the removable material layers 180 are in contact with the surrounding and parts of a lower surface of the first conductive layers 130. The lower surface of the first conductive layers 130 is partially in direct contact with the adhesive layer 140. Certainly, the portion of the first conductive layers 130 in contact with the removable material layers 180 is not limited thereto.

Figure 5H:
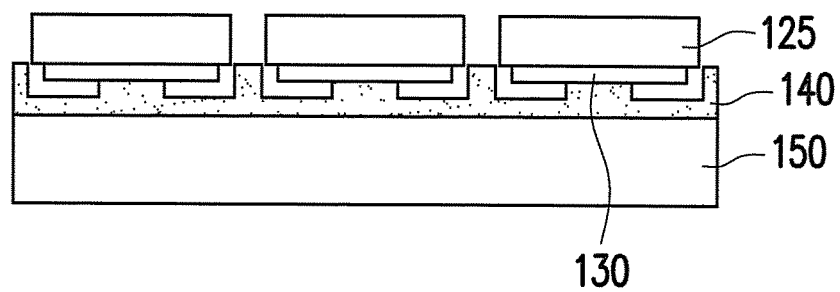

Next, as shown in FIG. 5D through FIG. 5G, the device layer 120, the first conductive layers 130 and the removable material layers 180 formed on the growth substrate 110 are bonded with the carrier 150 through the adhesive layer 140. The growth substrate 110 is removed, then, a thinning process may be optionally performed for the device layer 120. After that, the thinned device layer 120 is patterned. Then, as shown in FIG. 5H, the removable material layers 180 are removed. In the exemplary embodiment of this disclosure, the material of the removable material layers 180 is dielectric material, for example, silicon dioxide, silicon nitride, zinc oxide; and so on, or organic polymers. The removable material layers 180 are removed by a wet chemical etch process, a heating process, a laser irradiation process and so on. However, the disclosure is not limited thereto.

Figure 5I:
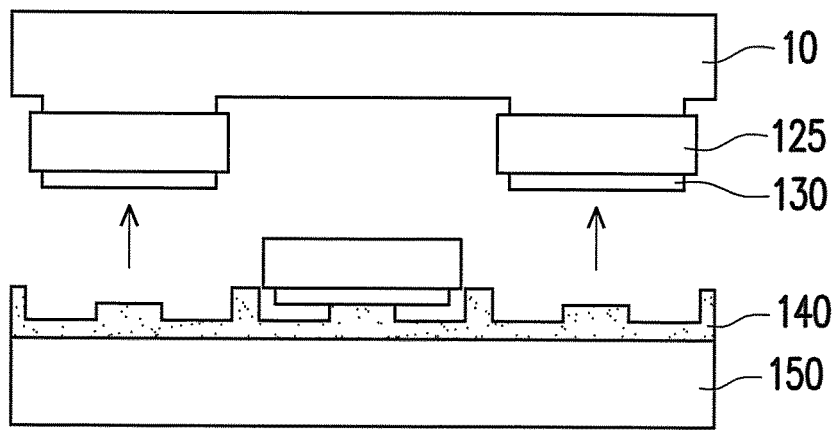
Figure 5J:
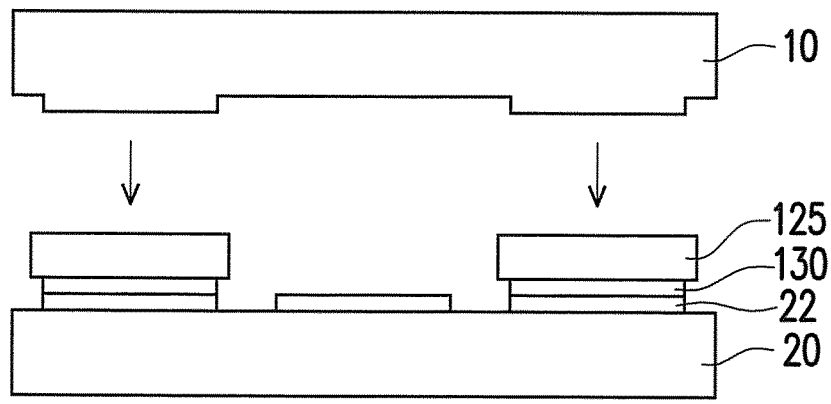

After the removable material layers 180 are removed, the adhesive layer 140 is partially in contact with the first conductive layers 130 to support the electronic devices 125 and the corresponding first conductive layers 130. As shown in FIG. 5I and FIG. 5J, the parts of the electronic devices 125 and the corresponding first conductive layers 130 are selectively picked-up from the carrier 150 via the picking-up and placing module 10, and the parts of the electronic devices 125 and the corresponding first conductive layers 130 are placed on the target substrate 20 by the picking-up and placing module 10.

In FIG. 1A through FIG. 1N, the supporting material layer 160 is disposed between the electronic devices 125, the supporting material layer 160 is patterned and the adhesive layer 140 is removed so as to form the gap between the first conductive layers 130 and the carrier 150. The electronic devices 125 and the first conductive layers 130 can be easily separated from the carrier 150. While in the present exemplary embodiment of this disclosure, after the removable material layers 180 are configured to be disposed on the position of contacting with the first conductive layers 130, only the removable material layers 180 are removed to form the gap between the first conductive layers 130 and the carrier 150, the electronic devices 125 and the first conductive layers 130 can be easily separated from the carrier 150. Therefore, compared with FIG. 1A through FIG. 1N, the present embodiment is easier to fabricate.

Figure 6A:
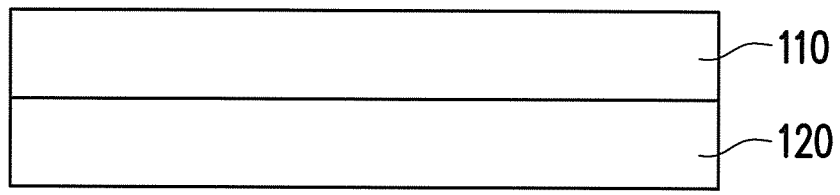
FIG. 6A through FIG. 6I schematically illustrate cross-sectional views of a picking-up and placing process for electronic devices in accordance with yet another embodiment of this disclosure.
Figure 6B:
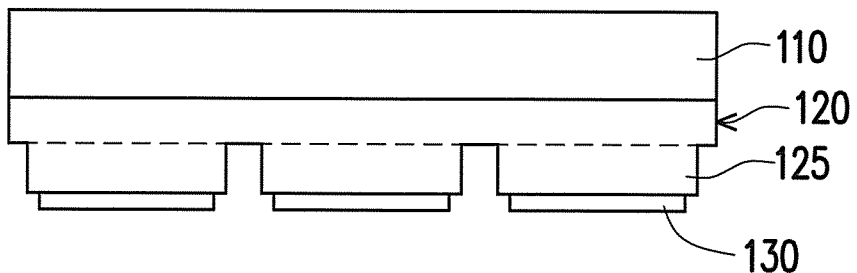
Figure 6C:
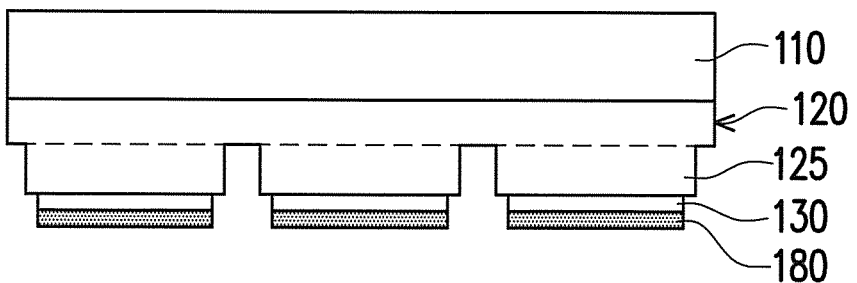
Figure 6D:
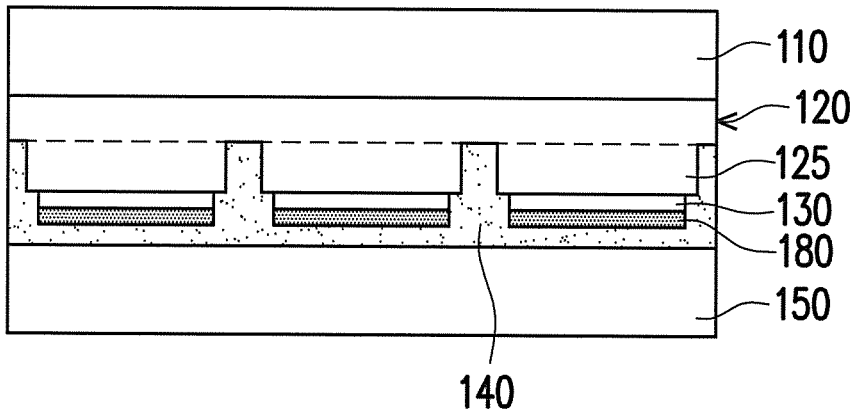
Figure 6E:
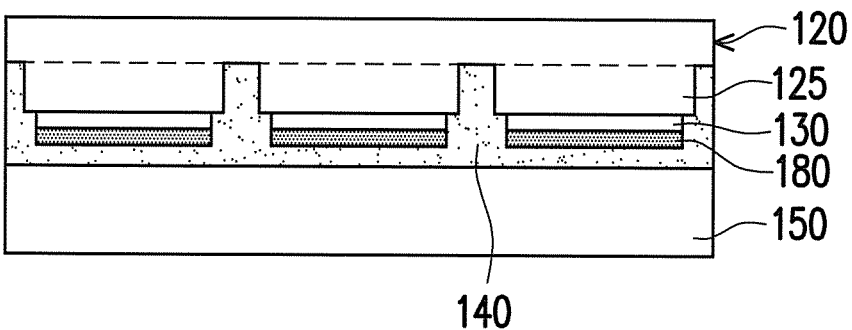
Figure 6F:
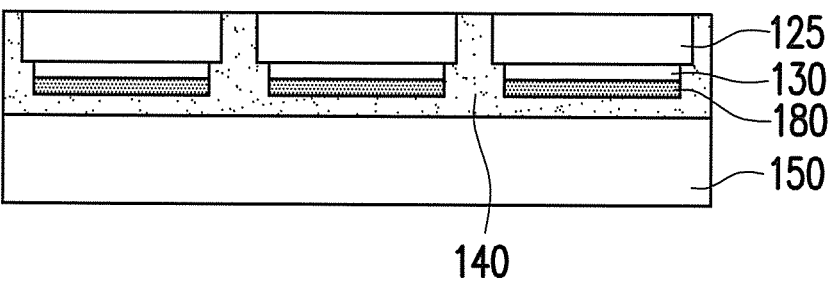

FIG. 6A through FIG. 6I schematically illustrate cross-sectional views of a picking-up and placing process for electronic devices in accordance with yet another embodiment of this disclosure. Referring to FIG. 6A through FIG. 6I, the processes of FIG. 6A and FIG. 6B are similar to the processes of FIG. 4A and FIG. 4B. The device layer 120 is formed on the growth substrate 110. The device layer 120 is patterned to form the electronic devices 125 arranged in an array. The first conductive layers 130 are formed on and corresponding to the electronic devices 125. As shown in FIG. 6C, the removable material layers 180 are formed on and in contact with the first conductive layers 130. In one of exemplary embodiments of this disclosure, the removable material layers 180 are in contact with the entire lower surface of the first conductive layers 130. However, the portion of the first conductive layers 130 in contact with the removable material layers 180 is not limited thereto.

Figure 6G:
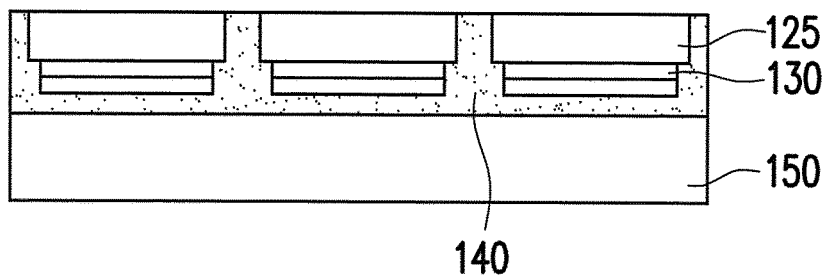
Figure 6H:
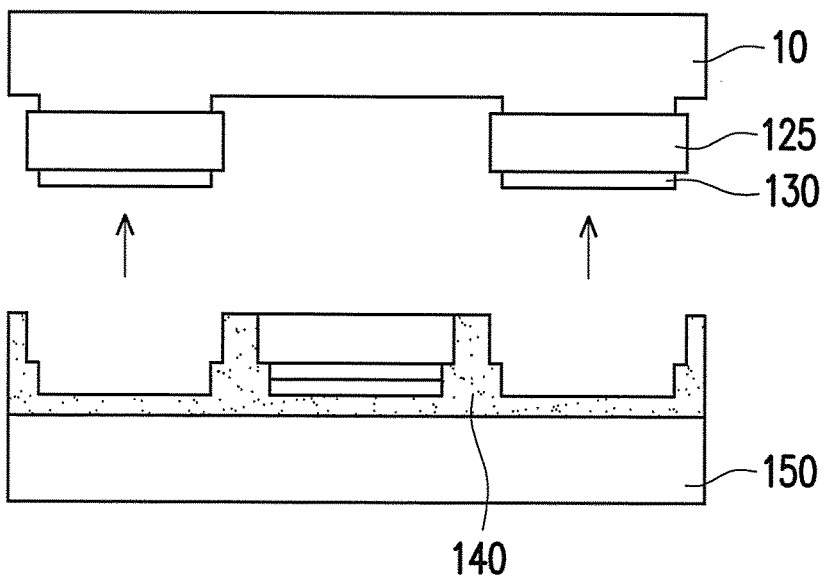
Figure 6I:
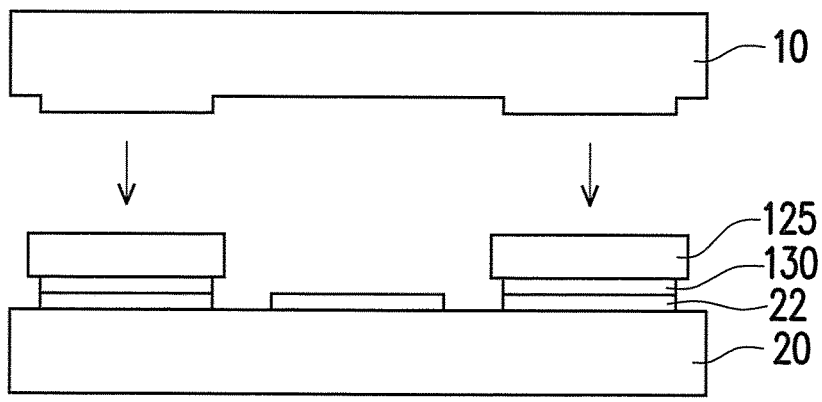

Next, the processes of FIG. 6D through FIG. 6G are similar to the processes of FIG. 5D through FIG. 5G. The device layer 120, the first conductive layers 130 and the removable material layers 180 formed on the growth substrate 110 are bonded with the carrier 150 through the adhesive layer 140. The growth substrate 110 is removed. Then, a thinning process may be optionally performed for the device layer 120 such that the electronic devices 125 are separated from one another. Then, as shown in FIG. 6G, the removable material layers 180 are removed. In one of exemplary embodiments of this disclosure, after the removable material layers 180 are removed so as to form the gap between the first conductive layers 130 and the carrier 150. It facilitates the future process of separation. Since the adhesive layer 140 is in contact with the sidewall of the electronic devices 125 and the first conductive layers 130, the adhesive layer 140 still supports the electronic devices 125 and the first conductive layers 130. Finally, the processes of FIG. 6H and FIG. 6I are similar to the processes of FIG. 1M and FIG. 1N. The parts of the electronic devices 125 and the corresponding first conductive layers 130 are selectively picked-up from the carrier 150 via the picking-up and placing module 10, and the parts of the electronic devices 125 and the corresponding first conductive layers 130 are placed on the target substrate 20 by the picking-up and placing module 10.

Figure 7:
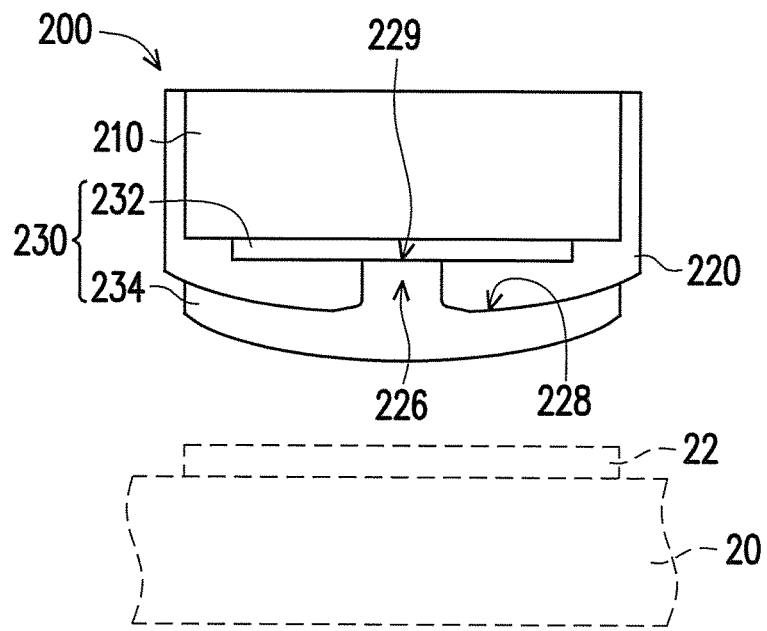
FIG. 7 is a cross-sectional view of a photoelectric device in accordance with an embodiment of this disclosure.

Take the electronic device is a photoelectric device as an example. The following provides a plurality of forms of the electronic device, which can be applied to the aforesaid picking-up and placing process for electronic devices. FIG. 7 is a cross-sectional view of a photoelectric device in accordance with an embodiment of this disclosure. Referring to FIG. 7, a photoelectric device 200 comprises a photoelectric element 210, a collimating element 220 and a first conductive layer 230. The collimating element 220 is disposed between the photoelectric element 210 and the first conductive layer 230. The collimating element 220 is a transparent dielectric layer with a curved surface structure, for example, micro lens. The collimating element 220 comprises a through hole 226. The first conductive layer 230 comprises a conductive pattern 232 disposed on the photoelectric element 210 and a metal layer 234 electronically connected the conductive pattern 232. The metal layer 234 is disposed on the collimating element 220 and connects the conductive pattern 232 via the through hole 226. As shown in FIG. 7, a width of the photoelectric element 210 is greater than that of the conductive pattern 232 of the first conductive layer 230. Specifically, in one of exemplary embodiments of this disclosure, the length and the width of the photoelectric element 210 are respectively ranged from 1 micro-meter to 100 micro-meters. The width of the photoelectric element 210 is greater than that of the corresponding conductive pattern 232 about 0.5-4 micro-meters. Such a width design may avoid the leakage caused by the condition that the conductive pattern 232 contacts the edge of the photoelectric element 210. In one of exemplary embodiments of this disclosure, the width of the metal layer 234 is equal to that of the photoelectric element 210, but in other one of exemplary embodiments of this disclosure, the width of the metal layer 234 is less than that of the photoelectric element 210.

Because the length and the width of the photoelectric device 200 are respectively ranged from 1 micro-meter to 100 micro-meters, the size of the photoelectric device 200 is too small to dispose an extra photo-structure for the photoelectric device 200 such that the photoelectric element 210 can emit collimated light. In one of exemplary embodiments of this disclosure, the collimating element 220 is disposed between the photoelectric element 210 and the metal layer 234 of the first conductive layer 230 for the photoelectric device 200. A part of light emitted from the photoelectric element 210 can be reflected by a first interface 228 between the collimating element 220 and the metal layer 234. And a part of light emitted from the photoelectric element 210 can be reflected by a second interface 229 between the metal layer 234 and the collimating element 220. It will achieve the effect that the light emitted from the photoelectric element 210 can be collimated.

In addition, in order to avoid an area of the through hole 226 is too large such that a ratio of an area of the first interface 228 between the collimating element 220 and the metal layer 234 is too small so that the light collimated condition is affected. In one of exemplary embodiments of this disclosure, the ratio of a cross-sectional area of the through hole 226 to a surface area of the photoelectric element 210 contacting with the conductive pattern 232 is less than 5%, to meet the desired photo requirements.

The refractive index of the material of the photoelectric element 210 is higher than the refractive index of the material of the collimating element 220. And the reflectivity of the metal layer 234 of the first conductive layer 230 is higher than 80%. For example, the refractive index is 2.39 while the photoelectric element 210 is Gallium Nitride (GaN), the refractive index is 1.45 while the collimating element 220 is Silicon Dioxide (SiO2), and the reflectivity is higher than 96% while the metal layer 234 of the first conductive layer 230 is silver. However, the selection of material is not limited thereto.

As shown in FIG. 7, in one of exemplary embodiments of this disclosure, the cross-sectional view of the first interface 228 between the collimating element 220 and the first conductive layer 230 is an arc. The light emitted from the photoelectric element 210 can be reflected by the first interface 228 between the collimating element 220 and the first conductive layer 230. And the light converges toward the center.

In addition, in one of exemplary embodiments of this disclosure, the photoelectric device 200 is placed on the target substrate 20 by the above-mentioned a plurality of picking-up and placing process for electronic devices. The target substrate 20 comprises a second conductive layer 22. The photoelectric device 200 is bonded with the second conductive layer 22 through the first conductive layer 230. The first conductive layer 230 and the second conductive layer 22 have magnetic permeability, the photoelectric device 200 is picked-up and placed on the target substrate 20 via a magnetic force, and the alignment between the first conductive layer 230 and the second conductive layer 22 can be easily achieved during the process of bonding them together. In other one of exemplary embodiments of this disclosure, the first conductive layer 230 and the second conductive layer 22 may not have magnetic permeability if the alignment accuracy is good.

Figure 8:
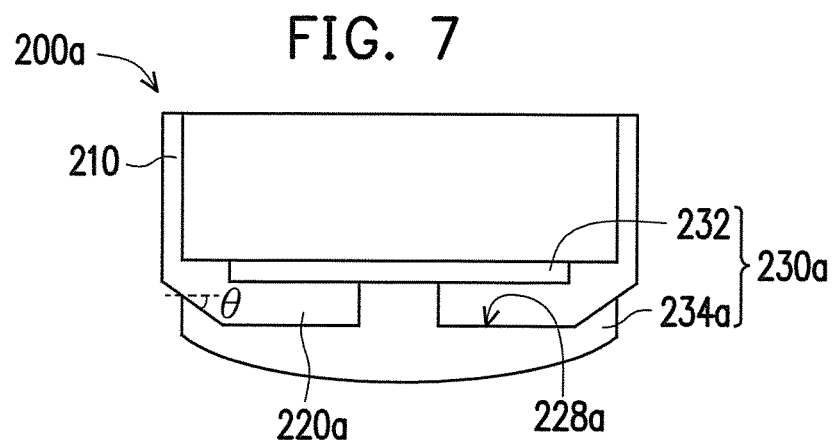
FIG. 8 and FIG. 9 are cross-sectional views of photoelectric devices in accordance with another embodiment of this disclosure.
Figure 9:
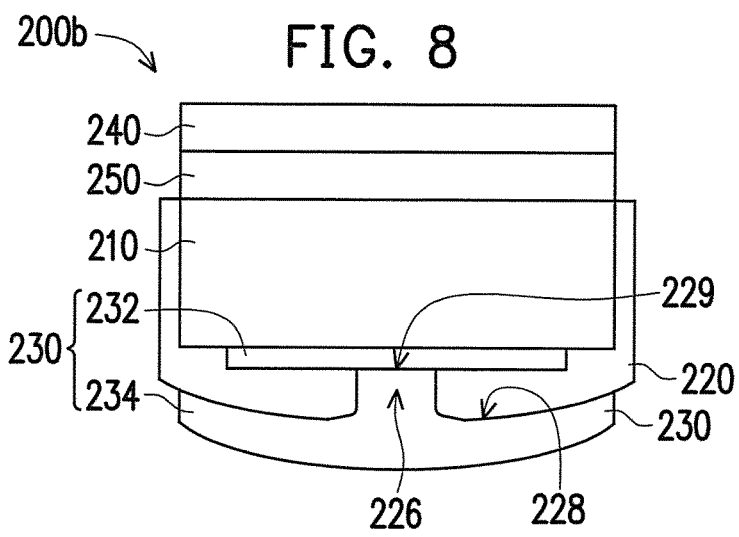

FIG. 8 and FIG. 9 are cross-sectional views of photoelectric device in accordance with another embodiment of this disclosure. As shown in FIG. 8, the main difference between the photoelectric device 200a in FIG. 8 and the photoelectric device 200 in FIG. 7 is that the cross-sectional view of the first interface 228a between the collimating element 220a and the metal layer 234a is a trapezoid in FIG. 8. Specifically, the longer bottom edge of the trapezoid is close to the photoelectric element 210, the shorter bottom edge of the trapezoid is away from the photoelectric element 210. The angle θ between the bottom edge and the both sides ranges from 20° to 80°. The height of the trapezoid ranges from 0.5 micro-meter to 2.0 micro-meters. The light emitted from the photoelectric element 210 can be reflected by the first interface 228a between the collimating element 220a and the metal layer 234a, it will achieve the light collimating effect by the above-mentioned design.

In other one of exemplary embodiments of this disclosure, the cross-sectional shape of the photoelectric element 210 may be not a rectangle, but be a trapezoid. The shape of the collimating element 220a may be conformal with the trapezoid-shaped photoelectric element 210. The shape of the first interface 228a between the collimating element 220a and the metal layer 234a shows a trapezoid.

It is noted that the shape of the interface between the collimating element 220, 220a and the metal layer 234, 234a may be other shapes in other one of exemplary embodiments of this disclosure, for example, the first interfaces 228, 228a between the collimating elements 220, 220a and the metal layers 234, 234a may be multi-curved surfaces or Fresnel lens. It will achieve light collimating effect after the light emitted from the photoelectric element 210 can be reflected by the first interfaces 228, 228a between the collimating elements 220, 220a and the metal layers 234, 234a. However, the scope of this disclosure is not limited to the foresaid shapes of the first interfaces 228, 228a between the collimating elements 220, 220a and the metal layers 234, 234a.

Referring to FIG. 9, the main difference between the photoelectric device 200b in FIG. 9 and the photoelectric device 200 in FIG. 7 is that, the photoelectric device 200b further comprises a third conductive layer 240 and a sacrificial layer 250 in one of exemplary embodiments of this disclosure. The photoelectric element 210 is disposed between the third conductive layer 240 and the collimating element 220. The sacrificial layer 250 is disposed between the photoelectric element 210 and the third conductive layer 240. In one of exemplary embodiments of this disclosure, at least one of the first conductive layer 230 and the third conductive layer 240 has magnetic permeability such that the photoelectric device 200b is placed on the target substrate 20 by the above-mentioned the picking-up and placing process for electronic devices (shown in FIG. 7). Certainly, in other one of exemplary embodiments of this disclosure, the sacrificial layer 250 is omitted in the photoelectric device 200b such that the third conductive layer 240 directly contacts with the photoelectric element 210.

Figure 10A:
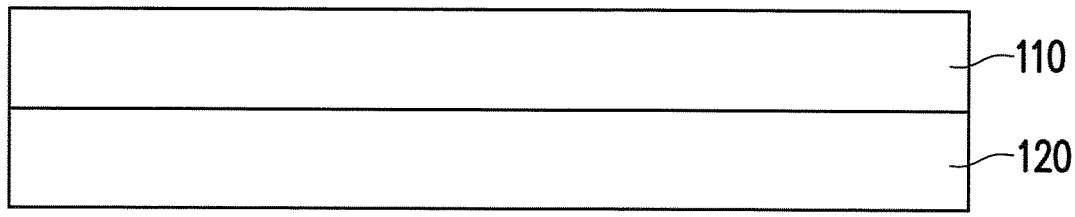
FIG. 10A through FIG. 10F schematically illustrate cross-sectional views of fabrication process of photoelectric device in accordance with an embodiment of this disclosure.

FIG. 10A through FIG. 10F schematically illustrate cross-sectional views of fabrication process of photoelectric device in accordance with an embodiment of this disclosure. Referring to FIG. 10A, a device layer 120 is formed on the growth substrate 110. In one of exemplary embodiments of this disclosure, the growth substrate 110 is, for example, a silicon substrate, a silicon carbide (SiC) substrate, a sapphire substrate or other suitable substrate. The device layer 120 is, for example, a light-emitting device layer, a photo-sensing layer, a photovoltaic device layer and so on. For instance, the device layer 120 is the light-emitting device layer, and the light-emitting device layer may be a horizontal structure light-emitting device layer or a vertical structure light-emitting device layer in accordance with the electrodes distributed.

Figure 10B:
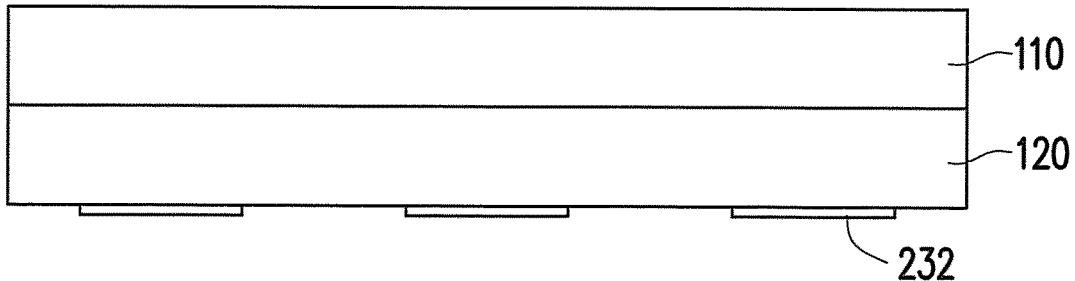

Referring to FIG. 10B, a plurality of conductive patterns 232 are formed on the device layer 120. In one of exemplary embodiments in this disclosure, the conductive patterns 232 are transparent. The material of the conductive patterns 232 is ITO, for example. However, the material of the conductive patterns 232 is not limited thereto.

Figure 10C:
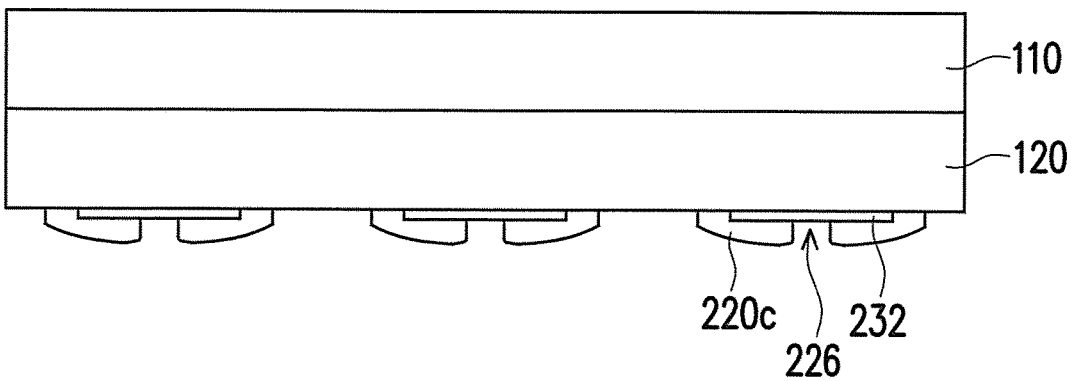

Referring to FIG. 10C, a plurality of collimating elements 220c are formed on the conductive patterns 232. In one of exemplary embodiments in this disclosure, the collimating elements 220c are transparent dielectric layer with a curved surface structure, for example, micro lens. A width of the collimating elements 220c is greater than that of the conductive patterns 232. The collimating elements 220c comprise the through hole 226 to expose parts of the conductive patterns 232.

Figure 10D:
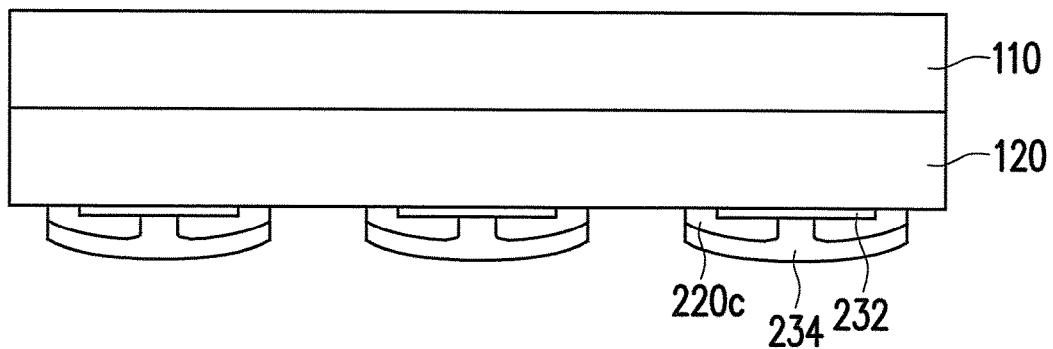
Figure 10E:
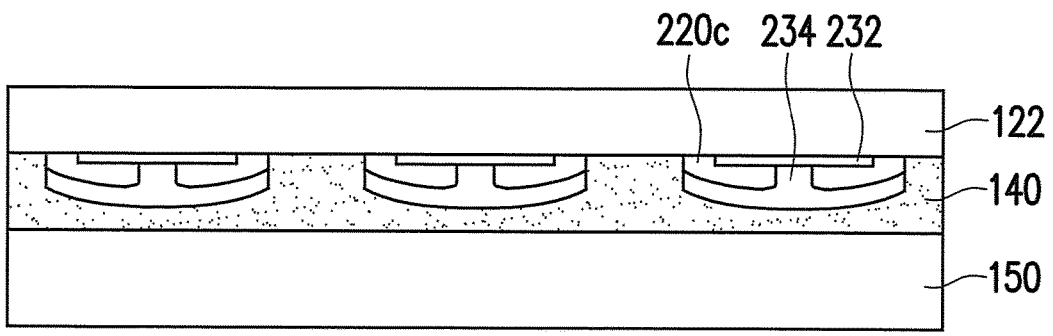

Referring to FIG. 10D, a plurality of metal layers 234 are formed on the collimating elements 220c. The metal layers 234 fill through the through hole 226 to connect the conductive patterns 232.

Referring 10E, the device layer 120, the conductive patterns 232, the collimating elements 220c and the metal layers 234 formed on the growth substrate 110 are bonded with the carrier 150 through the adhesive layer 140. The growth substrate 110 is removed, and a thinning process may be optionally performed for the device layer 120 such that the thickness of the device layer 120 can be reduced and become the thinned device layer 122.

Figure 10F:
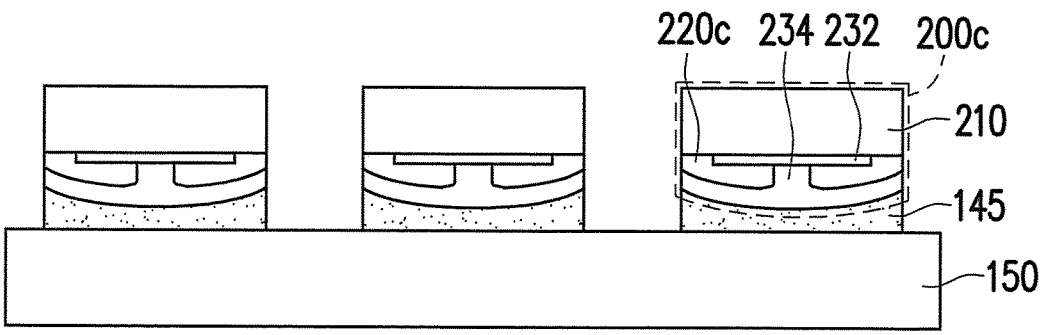

Referring FIG. 10F, the thinned device layer 122 is patterned to form the photoelectric elements 210 arranged in an array, a plurality of photoelectric devices 200c are manufactured and separated from one another. Specifically, the photoelectric devices 200c comprise the photoelectric elements 210, the conductive patterns 232, the collimating elements 220c and the metal layers 234; wherein the conductive patterns 232, the collimating elements 220c and the metal layers 234 are sequentially disposed on the photoelectric elements 210. The collimating elements 220c is disposed between the photoelectric elements 210 and the metal layers 234 of the first conductive layers 230 in the photoelectric devices 200c. The parts of light emitted from the photoelectric elements 210 can be reflected by the interface between the collimating elements 220c and the metal layers 234. It will achieve the effect that the light emitted from the photoelectric elements 210 can be collimated.

In addition, in the photoelectric devices 200c, the length and the width of each of the photoelectric elements 210 are respectively ranged from 1 micro-meter to 100 micrometers. The width of each of the photoelectric elements 210 is greater than the width of the corresponding conductive patterns 232 about 0.5-4 micro-meters. Such a width design may avoid the leakage caused by the condition that the conductive pattern 232 contacts the edge of the photoelectric element 210.

Moreover, referring to FIG. 10F, after the thinned device layer 122 is patterned, the adhesive layer 140 is patterned to form a plurality of adhesive patterns 145 corresponding to the photoelectric elements 210 and to expose the parts of the carrier 150. The processes of FIG. 1G through FIG. 1N may be continuously performed, namely, the supporting material layer 160 is disposed on the carrier 150, the supporting material layer 160 is patterned, the photoelectric devices 200c are picked-up and placed on the target substrate 20, and a low-temperature bonding process is performed such that the metal layers 234 are bonded with the target substrate 20 through the second conductive layers 22.

In other words, in one of exemplary embodiments of this disclosure, the metal layers 234 comprise metal layers or alloy layers having a melting point lower than 250 degrees Celsius. Specifically, the metal layers 234 may comprise In with melting point of 156 degrees, Sn with melting point of 231 degrees, InAg with a ratio of In higher than 0.85, InAu with a ratio of In higher than 0.95, InSn and InCu with a ratio of In higher than 0.95, SnAg with a ratio of Sn higher than 0.9, SnAu with a ratio of Sn higher than 0.85 or SnCu with a ratio of Sn higher than 0.95. The second conductive layers 22 comprise metal layers or alloy layers having a melting point higher than 250 degrees Celsius. Specifically, the second conductive layers 22 may comprise Ag with melting point of 961 degrees, Au with melting point of 1064 degrees or Cu with melting point of 1084 degrees.

After the photoelectric devices 200c are bonded with the target substrate 20 under the temperature lower than 250 degrees Celsius. The alloy layer 135 is formed between the photoelectric element 210 and the target substrate 20, as shown in FIG. 1N'. The alloy layer 135 comprises metal having a melting point higher than 300 degrees Celsius. The material of the alloy layer 135 comprises a binary system, for example, InAg, InAu, InSn, InCu, SnAg, SnAu, SnCu, or a ternary system, for example, InSnAg, InSnAu, InSnCu, InAuAg, InAuCu, InAgCu, SnAgAu, SnAgCu, SnAuCu and so on. The alloy layer 135 comprises at least 40% of a low melting point metal or alloy, the melting point of the metal or the alloy is lower than 250 degrees Celsius. In one of exemplary embodiments of this disclosure, the alloy layer 135 comprises at least 50% of the low melting point metal or alloy, the melting point of the metal or the alloy is lower than 250 degrees Celsius.

In view of the foregoing, the disclosure provides a picking-up and placing process for electronic devices comprising a plurality of forming processes for electronic devices, a plurality of processes for supporting the parts of the first conductive layer through the supporting material layer or the adhesive layer before a picking-up and placing process such that the electronic devices and the first conductive layer can be separated from the carrier, and the picking-up and placing process for the electronic devices from the carrier onto the target substrate and bonding with the target substrate. The picking-up and placing process for electronic devices of the disclosure may be s applicable to the electronic devices of a size ranging from 1 micro-meter to 100 micro-meters, and the microelectronic devices can be quickly and efficiently picked-up and placed on the target substrate. In addition, the disclosure also provides an electronic module, and an alloy layer is formed between the electronic devices and the target substrate, wherein the alloy layer comprises at least 40% of metal having a melting point lower than 250 degrees Celsius, and the melting point of the alloy layer is higher than 300 degrees Celsius. Moreover, the disclosure provides a plurality of photoelectric devices which comprise the aforesaid electronic devices and can be applied to the aforesaid picking-up and placing process for electronic devices. The light emitted from the micro photoelectric devices can have a better collimation and provides a better quality of light emitting.

It will be apparent to those skilled in the art that various modifications and variations can be made to the present disclosure. It is intended that the specification and examples be considered as exemplary embodiments only, with a scope of the disclosure being indicated by the following claims and their equivalents.

What is claimed is:

1. A picking-up and placing process for electronic devices, comprising:
    forming a plurality of electronic devices arranged in an array on a carrier, wherein a first conductive layer having a conductive pattern is disposed between each of the plurality of electronic devices and the carrier, and a width of the plurality of electronic devices is greater than that of the corresponding conductive pattern;
    selectively picking-up parts of the plurality of electronic devices and corresponding first conductive layers from the carrier via a picking-up and placing module;
    placing the parts of the plurality of electronic devices and the corresponding first conductive layers on a target substrate by the picking-up and placing module; and
    performing a low-temperature bonding process to form an alloy layer for bonding the parts of the plurality of electronic devices with the target substrate when the parts of the electronic devices are placed on the target substrate, wherein the alloy layer comprises at least 40% of a low melting point metal, a first melting point of the low melting point metal is lower than 250 degrees Celsius, and a second melting point of the alloy layer is higher than 300 degrees Celsius.

2. The picking-up and placing process for electronic devices according to claim 1, wherein a method for forming the plurality of electronic devices comprises:
    forming a device layer on a growth substrate, the device layer comprising the plurality of electronic devices arranged in an array;
    forming the first conductive layers on the device layer at positions corresponding to the plurality of electronic devices;
    bonding the device layer and the first conductive layers on the growth substrate with the carrier through an adhesive layer;
    removing the growth substrate; and
    patterning the device layer.

3. The picking-up and placing process for electronic devices according to claim 2 further comprising:
    patterning the adhesive layer to form a plurality of adhesive patterns after the plurality of electronic devices are formed, the adhesive patterns being corresponding to the first conductive layers, and the carrier being partially exposed;
    forming a supporting material layer on the carrier, wherein the supporting material layer is between the plurality of electronic devices;
    partially removing the supporting material layer between the plurality of electronic devices; and
    removing the adhesive patterns.

4. The picking-up and placing process for electronic devices according to claim 3, wherein the remaining supporting material layer is symmetrically formed around the plurality of electronic devices after the supporting material layer between the plurality of electronic devices is partially removed.

5. The picking-up and placing process for electronic devices according to claim 3, wherein the remaining supporting material layer is asymmetrically formed around the plurality of electronic devices after the supporting material layer between the plurality of electronic devices is partially removed.

6. The picking-up and placing process for electronic devices according to claim 3, wherein each of the electronic devices has a first surface facing the carrier and a second surface opposite to the first surface, a height of the supporting material layer on the carrier is greater than a first distance from the first surface to the carrier and less than a second distance from the second surface to the carrier when the supporting material layer is formed on the carrier and the supporting material layer is between the plurality of electronic devices.

7. The picking-up and placing process for electronic devices according to claim 2 further comprising:
    thinning the device layer after the growth substrate is removed.

8. The picking-up and placing process for electronic devices according to claim 2, wherein the plurality of electronic devices is separated from one another and arranged on the carrier after the device layer is patterned.

9. The picking-up and placing process for electronic devices according to claim 2, wherein the electronic devices connected to or separated from one another are arranged on the growth substrate after the device layer is patterned.

10. The picking-up and placing process for electronic devices according to claim 9 further comprising:
    forming a plurality of removable material layers in contact with the first conductive layers after the device layer is patterned, and
    removing the removable material layers after the growth substrate is removed.

11. The picking-up and placing process for electronic devices according to claim 2 further comprising:

forming a plurality of removable material layers on the device layer after the first conductive layers are formed on the device layer, wherein the plurality of removable material layers is in contact with the first conductive layers; and removing the removable material layers after the device layer is patterned.

12. The picking-up and placing process for electronic devices according to claim 1, wherein the target substrate comprises a plurality of second conductive layers arranged in an array, each of the first conductive layers comprises a metal layer connected to the conductive pattern, and the parts of the plurality of electronic devices placed by the picking-up and placing module are connected to parts of the plurality of second conductive layers via the corresponding metal layers of the first conductive layers between the plurality of electronic devices and the carrier.

13. The picking-up and placing process for electronic devices according to claim 12, wherein the metal layers have a magnetic permeability and the second conductive layers have the magnetic permeability.

14. The picking-up and placing process for electronic devices according to claim 1 further comprising:

forming a third conductive layer on each of the plurality of electronic devices after the plurality of electronic devices are formed and arranged in an array on the carrier, wherein each of the plurality of electronic devices is disposed between the first conductive layer and the third conductive layer, and the parts of the plurality of electronic devices, the corresponding first conductive layers and the corresponding third conductive layers are placed on the target substrate by the picking-up and placing module.

15. The picking-up and placing process for electronic devices according to claim 14, wherein at least one of each first conductive layer and each corresponding third conductive layer has a magnetic permeability.

16. The picking-up and placing process for electronic devices according to claim 14, wherein a sacrificial layer is disposed between each third conductive layer and each corresponding electronic device.

17. The picking-up and placing process for electronic devices according to claim 16 further comprising:

removing the sacrificial layers and the third conductive layers on the target substrate after the parts of the plurality of electronic devices, the corresponding first conductive layers and the corresponding third conductive layers are placed on the target substrate.

18. The picking-up and placing process for electronic devices according to claim 1, wherein the low melting point metal includes indium, tin, indium-silver alloy with a first ratio of indium higher than 0.85, indium-gold alloy with a second ratio of indium higher than 0.95, indium-tin alloy, indium-copper alloy with a third ratio of indium higher than 0.95, tin-silver alloy with a fourth ratio of tin higher than 0.9, tin-gold alloy with a fifth ratio of tin higher than 0.85 or tin-copper alloy with a sixth ratio of tin higher than 0.95, and the alloy layer includes indium-silver alloy, indium-gold alloy, indium-tin alloy, indium-copper alloy, tin-silver alloy, tin-gold alloy, tin-copper alloy, indium-tin-silver alloy, indium-tin-gold alloy, indium-tin-copper alloy, indium-gold-silver alloy, indium-gold-copper alloy, indium-silver-copper alloy, tin-silver-gold alloy, tin-silver-copper alloy or tin-gold-copper alloy.

19. An electronic module, comprising:

a target substrate;

an electronic device disposed on the target substrate; and an alloy layer disposed between the target substrate and the electronic device, wherein the alloy layer comprises at least 40% of a low melting point metal, a first melting point of the low melting point metal is lower than 250 degrees Celsius and a second melting point of the alloy layer is higher than 300 degrees Celsius.

20. The electronic module according to claim 19, wherein the low melting point metal includes indium, tin, indium-silver alloy with a first ratio of indium higher than 0.85, indium-gold alloy with a second ratio of indium higher than 0.95, indium-tin alloy, indium-copper alloy with a third ratio of indium higher than 0.95, tin-silver alloy with a fourth ratio of tin higher than 0.9, tin-gold alloy with a fifth ratio of tin higher than 0.85 or tin-copper alloy with a sixth ratio of tin higher than 0.95, and the alloy layer includes indium-silver alloy, indium-gold alloy, indium-tin alloy, indium-copper alloy, tin-silver alloy, tin-gold alloy, tin-copper alloy, indium-tin-silver alloy, indium-tin-gold alloy, indium-tin-copper alloy, indium-gold-silver alloy, indium-gold-copper alloy, indium-silver-copper alloy, tin-silver-gold alloy, tin-silver-copper alloy or tin-gold-copper alloy.

* * * * *